(12) United States Patent
Forrest et al.

(10) Patent No.: US 7,061,011 B2
(45) Date of Patent: Jun. 13, 2006

(54) BIPOLAR ORGANIC DEVICES

(75) Inventors: Stephen R. Forrest, Princeton, NJ (US); Jiangeng Xue, Piscataway, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 10/721,072

(22) Filed: Nov. 26, 2003

(65) Prior Publication Data

US 2005/0110005 A1    May 26, 2005

(51) Int. Cl.
*H01L 35/24* (2006.01)

(52) U.S. Cl. .................. 257/40; 257/103; 257/461; 438/82; 438/99

(58) Field of Classification Search .............. 257/40, 257/431, 461, E51.017, E51.01, 103, E51.018; 438/82, 99

See application file for complete search history.

(56) References Cited

U.S. PATENT DOCUMENTS

| | | | |
|---|---|---|---|
| 4,728,593 A * | 3/1988 | Freilich et al. | 430/72 |
| 5,247,190 A | 9/1993 | Friend et al. | |
| 5,629,530 A * | 5/1997 | Brown et al. | 257/40 |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |

(Continued)

OTHER PUBLICATIONS

Foster, R., "Organic Charge-Transfer Complexes", (Table 1.1), Academic Press, (1969).*

(Continued)

*Primary Examiner*—Kenneth Parker
*Assistant Examiner*—Matthew Landau
(74) *Attorney, Agent, or Firm*—Kenyon & Kenyon LLP

(57) ABSTRACT

An organic device is provided, having a first electrode and a second electrode. A first organic layer is disposed between the first electrode and the second electrode. The first organic layer includes a first organic material, with a concentration of at least 50% molar, and a second organic material, with a concentration less than 50% molar. A second organic layer is also disposed between the first electrode and the second electrode. The second organic layer includes the second organic material, with a concentration of at least 50% molar, and the first organic material, with a concentration less than 50% molar. The first organic material may act as an n-dopant in the second organic layer, and the second organic material may act as a p-dopant in the first organic layer. Alternately, the first organic material may act as a p-dopant in the second organic layer, and the second organic material may act as an n-dopant in the first organic layer. Exemplary materials for the first and second organic materials include PTCDA and BTQBT. Devices that may be fabricated include organic light emitting devices, organic transistors, and organic photosensitive devices. Preferably, the electron affinity of the first organic material is within about 0.4 eV of the ionization potential of the second organic material, and more preferably within about 0.2 eV. The first and second organic layers may also be used in separate devices fabricated on the same substrate. A method of fabricating devices is provided, by co-depositing the first and second organic materials at different concentrations in different layers, such that a different material is the host in different layers.

17 Claims, 17 Drawing Sheets

U.S. PATENT DOCUMENTS

| | | | |
|---|---|---|---|
| 6,303,238 | B1 | 10/2001 | Thompson et al. |
| 6,320,117 | B1 * | 11/2001 | Campbell et al. ............ 136/258 |
| 6,337,102 | B1 | 1/2002 | Forrest et al. |
| 6,468,819 | B1 | 10/2002 | Kim et al. |
| 2003/0230980 | A1 | 12/2003 | Forrest et al. |

OTHER PUBLICATIONS

Sugunan et al., "Electron Donating and Acid-Base Properties of Cerium Oxide and its Mixed Oxides with Alumia", Aug. 11, 1994, Collect. Czech. Chem. Commun. (vol. 59), pp. 2604-2610.*

Huang et al., "Low-Voltage Organic Electroluminescent Devices Using pin Structures," Appl. Phys. Lett. 80,139 (2002).

C. Shen et al., "Electronic Structure, Diffusion, and $p$-doping at the $AuF_{16}CuPc$ Interface," Journal of Applied Physics, vol. 90(9), 4595-4554, (2001).

Pfeiffer et al., "Electrophosphorescent p-I-n Organic Light-Emitting Devices for Very-High-Efficiency Flat-Panel Displays," Adv. Mater. 14, 1633.

Forrest, "Ultrathin Organic Films Grown by Organic Molecular Beam Deposition and Related Techniques," Chem. Rev. 97, 1793 (1997).

Gao et al., "Electronic Structure and Current Injection in Zinc Phthalocyanine Doped with Tetrafluorotetracyanoquinodimethane: Interface Versus Bulk Effects," Org. Electron 3, 53 (2002).

Zhou et al., "Enhanced Hole Injection into Amorphous Hole-Transport Layers of Organic Light-Emitting Diodes Using Controlled p-Type Doping," Adv. Funct. Mater. 11, 310 (2001).

Kido et al., "Bright Organic Electroluminescent devices Having a Metal-Doped Electron-Injecting Layer," Appl. Phys. Lett. 73, 2866 (1998).

Huang et al., "Influence of the thickness and doping of the emission layer on the performance of organic light-emitting diodes with PIN structure," J. Appl. Phys. 93, 838 (2003).

Werner et al., "Pyronin B as a Donor for n-type Doping of Organic Thin Films," Appl. Phys. Lett. 82, 4495 (2003).

Hill et al., "Organic Semiconductor Interfaces: Electronic Structure and Transport Properties," Appl. Surf.Sci. 166, 354 (2000).

Fujimoto et al., Electronic Structure of bis [1, 2, 5,] thiadiazolo-p-quinobis (1,3-dithiole) (BTQBT) studied by ultraviolet photoemission spectroscopy, Chem. Phys. 165, 135 (1992).

Xue et al., "Organic Thin-Film Transistors Based on bis (1,2,5-thiadiazolo)-p-quinobis (1,3dithiole)," Appl. Phys. Lett. 79, 3714 (2001).

Blochwitz et al., "Interface Electronic Structure of Organic Semiconductors with Controlled Doping Lebels," Org. Electron. 2, 97(2001).

Gao et al., "Controlled p doping of the hole-transport molecular material N,N'-diphenyl-N,n'-bis (1-naphthyl)-1,1'-biphenyl4,4'-diamine with tetrafluorotetracyanoquinodimethane," J. App. Phys. 94, 359 (2003).

Xue et al., "Characterization of bis(1,2,5-thiadiazole_p-quinobis(1,3-dithiole) thin films grown by organic molecular beam deposition," Org. Electron. 2, 143 (2001).

Takada, et al., "BTQBT (bis-(1, 2, 5-thiadiazolo)-p-quinobis(1, 3-dithiole)) Thin Films; A Promising Candidate for High Mobility Organic Transistors," Jpn. J. Appl. Phys. 41, L4 (2002).

Pfeiffer et al., "Controlled Doping of Phthalocyanine Layers by Cosublimination with Acceptor Molecules: A Systematic Seeback and Conductivity Study," Appl. Phys. Lett. 73, 3202 (1998).

Maenning et al., "Controlled p-type doping of polycrystalline and amorphous organic layers: Self-consistent description of conductivity and field-effect mobility by a microscopic percolation model," Phys. Rev. B 64, 195208 (2001).

Schmechel, "Hopping transport in doped organic semiconductors: A theoretical approach and its application to -pdoped zinc-phthalocyanine," J. Appl. phys. 93, 4653 (2003).

Scholz et al., "Resonant Raman spectroscopy of 3,4,9,10-perylene-tetracarboxylic-dianhydride epitaxial films," Phys. Rev. B 61, 13659 (2000).

Pfeiffer et al., Adv. Solid State Phys. 39, 77 (1999).

U.S. Appl. No. 09/931,948 to Lu et al., filed—.

U.S. Appl. No. 10/233,470.

A. Nollau et al., "Controlled n-type doping of a molecular organic semiconductor: Naphthalenetetracarboxylic dianhydride (NTCDA) doped with bis(ethylenedithio)-tetrathiafulvalene (BEDT-TTF)", Journal of Applied Physics, vol. 87, No. 9, pp. 4340-4343, May 1, 2000.

J. Xue et al., "Organic optical bistable switch", Applied Physics Letters, vol. 82, No. 1, pp. 136-138, Jan. 6, 2003.

P. Peumans et al., "Small molecular weight organic thin-film photodetectors and solar cells", Journal of Applied Physics, vol. 93, No. 7, pp. 3693-3723, Apr. 1, 2003.

P. Peumans, et al., "Efficient, high-bandwidth organic multilayer photodetectors", Applied Physics Letters, vol. 76, No. 26, pp. 3855-3857, Jun. 26, 2000.

* cited by examiner

BIPOLAR ORGANIC DEVICES

JOINT RESEARCH AGREEMENT

The claimed invention was made by, on behalf of, and/or in connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

1. Field of the Invention

The present invention relates to organic devices, and more specifically to organic devices having bipolar doping.

2. Background

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

As used herein, "solution processible" means capable of being dissolved, dispersed, or transported in and/or deposited from a liquid medium, either in solution or suspension form.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

SUMMARY OF THE INVENTION

An organic device is provided, having a first electrode and a second electrode. A first organic layer is disposed between the first electrode and the second electrode. The first organic layer includes a first organic material, with a concentration of at least 50% molar, and a second organic material, with a concentration less than 50% molar. A second organic layer is also disposed between the first electrode and the second electrode. The second organic layer includes the second organic material, with a concentration of at least 50% molar, and the first organic material, with a concentration less than 50% molar. The first organic material may act as an n-dopant in the second organic layer, and the second organic material may act as a p-dopant in the first organic layer. Alternately, the first organic material may act as a p-dopant in the second organic layer, and the second organic material may act as an n-dopant in the first organic layer. Exemplary materials for the first and second organic materials include PTCDA and BTQBT. Devices that may be fabricated include organic light emitting devices, organic transistors, and organic photosensitive devices (including organic photodetectors and organic photovoltaic cells). Preferably, the electron affinity of the first organic material is within about 0.4 eV of the ionization potential of the second organic material, and more preferably within about 0.2 eV. The first and second organic layers may also be used in separate devices fabricated on the same substrate. A method of fabricating devices is provided, by co-depositing the first and second organic materials at different concentrations in different layers, such that a different material is the host in different layers.

DETAILED DESCRIPTION

Figure 1:
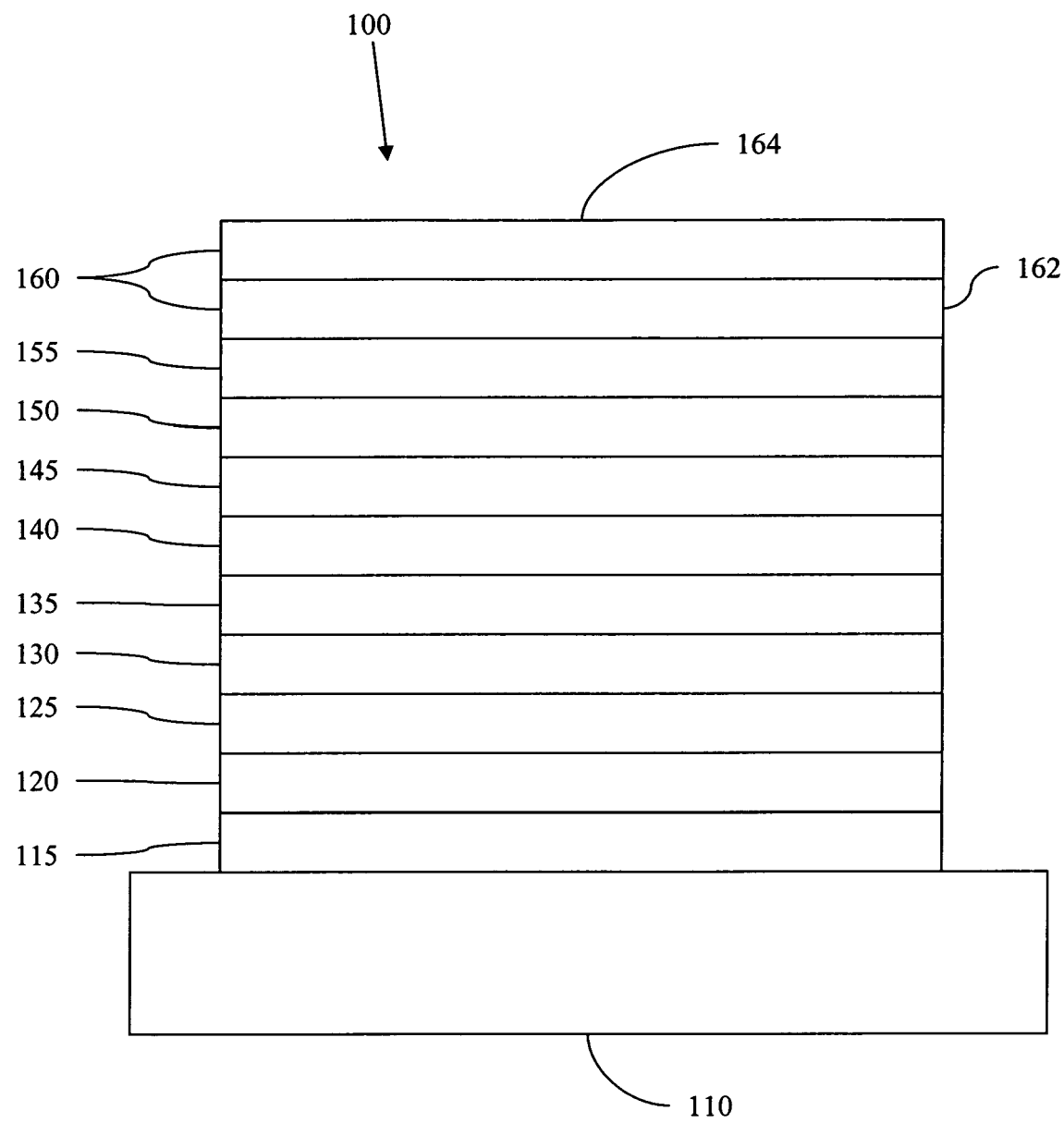
FIG. 1 shows an organic light emitting device (OLED) 100 that may be fabricated in accordance with embodiments of the invention.

In an embodiment of the invention, a pair of organic materials are selected, such that the electron affinity of a first organic material is close to the ionization potential of the a second organic material. As a result, the LUMO of the first organic material will be close to the HOMO of the second organic material. Preferably, the electron affinity of the first organic material is within about 0.4 eV of the ionization potential of the second organic material, and more preferably within about 0.2 eV. As a result, when the two materials are mixed, it is energetically likely that electrons will move from the second material to the first material. If a layer is formed with the first organic material as the host and the second organic material as a dopant, the second organic material may act as a donor, i.e., an n-type dopant, and increase the concentration of electrons in the layer relative to a layer formed of only the first organic material. Similarly, if a layer is formed with the second organic material as the host and the first organic material as a dopant, the first organic material may act as an acceptor, i.e., a p-type dopant, and increase the concentration of holes in the layer relative to a layer formed of only the second organic material.

In an embodiment of the invention, bipolar doping is investigated between a molecular organic system consisting of two planar-stacking compounds, 3,4,9,10-perylenetetracarboxylic dianhydride (PTCDA) and bis(1,2,5-thiadiazolo)-p-quinobis(1,3-dithiole) (BTQBT). Due to the small ionization potential of BTQBT (4.8 eV) and the large electron affinity of PTCDA (4.4 eV), partial electron transfer from BTQBT molecules to PTCDA molecules is observed. Combining ultraviolet photoemission spectroscopy with in-plane conductivity and field-effect transistor measurements, it is shown that BTQBT molecules act as donors in PTCDA, while PTCDA molecules are acceptors when doped into BTQBT. The strong intermolecular interaction between these materials enables efficient separation of doping-generated charge carriers from the ionized dopant molecules. However, infrared spectroscopy shows that the degree of charge transfer between BTQBT and PTCDA is much less than one electron. A stronger donor-acceptor couple may result in more efficient charge transfer and improved overall doping efficiency. In addition to PTCDA and BTQBT, there are other pairs of organic materials that have electron affinities and ionization potentials such that bipolar doping is expected to work. For example, hexadecafluorophthalocyanine (F16-CuPc) has an ionization potential of 6.3 eV, see C. Shen et al., Journal of Applied Physics 90, 4595 (2001), which in incorporated by reference in its entirety, and a HOMO-LUMO gap of 1.5 eV. As a result, F16-CuPc is expected to have an electron affinity of 4.8 eV, about 0.3 eV smaller than the ionization potential of CuPc, such that CuPc and F16-CuPc may work as an appropriate donor-acceptor pair. Another such pair is BTQBT and F16-CuPc.

Doping BTQBT with PTCDA causes the Fermi level shift from the mid-gap to 0.3 eV above the BTQBT HOMO, whereas doping PTCDA with BTQBT shifts the Fermi level from 0.3 eV to 0.2 eV below the PTCDA LUMO. Therefore, BTQBT molecules act as donors in PTCDA, whereas PTCDA molecules act as acceptors in BTQBT. A significant increase in the in-plane conductivity as well as a reduction in its thermal activation energy are observed in doped films as a result of the electrical doping. No significant phase segregation in coevaporated films is observed. The charge transfer between BTQBT and PTCDA is as energetically favorable as it could be in other systems, as the ionization potential of BTQBT is larger than the electron affinity of PTCDA, so the overall doping efficiency may be somewhat limited. Using a stronger donor and/or a stronger acceptor may improve the doping efficiency.

For inorganic semiconductors, controlled doping is one of the key technologies in the advance of electronic and optoelectronic devices. The conductivity of intrinsic inorganic semiconductors can be increased by many orders of magnitude by intentionally introducing appropriate impurity atoms into the semiconductors, which provides low series resistance in thick transport layers as well as ohmic contacts to metal electrodes (via degeneracy doping). Moreover, various functionalities can be achieved in a device by engineering the doping profile (dopant type and concentration). Despite the importance of doping to inorganic semiconductor devices, doping of molecular organic materials has not received much attention, mainly due to the success in making highly efficient organic light-emitting devices (OLEDs) using thin (10 to 50 nm thick) but undoped electron and hole transport layers (ETLs and HTLs, respectively) to minimize voltage drops in these layers. However, devices with thin structures may have disadvantages in terms of device stability and manufacturing complexity. See, X. Zhou, J. Blochwitz, M. Pfeiffer, A. Nollau, T. Fritz, and K. Leo, Adv. Funct. Mater. 11, 310 (2001), which is incorporated by reference in its entirety. With the vast improvement in performance of organic devices in the last two decades, there is a need for doping organic materials to further improving device performance. It has been demonstrated that p-doping the HTL and n-doping the ETL in an OLED can enhance carrier injection from the electrodes and reduce the ohmic losses in the respective layers, leading to lower drive voltages and higher luminance efficiencies. See, J. Huang, M. Pfeiffer, A. Werner, J. Blochwitz, K. Leo, and S. Liu, Appl. Phys. Lett. 80, 139 (2002); and M. Pfeiffer, S. R. Forrest, K. Leo, and M. E. Thompson, Adv. Mater. 15, 1633 (2002), which are incorporated by reference in their entireties. Doping may also potentially reduce the high contact resistance in organic thin-film transistors (OTFTs), and lead to realization of other types of electronic devices based on organic materials, such as bipolar transistors and tunnel diodes.

It is also interesting to investigate the doping mechanisms in molecular organic materials. A strong acceptor molecule, tetrafluorotetracyanoquinodimethane ($F_4$-TCNQ), has been used as the p-dopant in materials such as phthalocyanines, see, W. Gao and A. Kahn, Org. Electron. 3, 53 (2002); and M. Pfeiffer, A. Beyer, T. Fritz, and K. Leo, Appl. Phys. Lett.

73, 3202 (1998), which are incorporated by reference in their entireties, as well as in materials such as starbust amine derivatives, see X. Zhou, J. Blochwitz, M. Pfeiffer, A. Nollau, T. Fritz, and K. Leo, Adv. Funct. Mater. 11, 310 (2001); and J. Huang, M. Pfeiffer, A. Werner, J. Blochwitz, K. Leo, and S. Liu, Appl. Phys. Lett. 80, 139 (2002), which are incorporated by reference in their entireties. The electron affinity (EA), or the energy difference between the vacuum level and the lowest unoccupied molecular orbital (LUMO), of $F_4$-TCNQ closely matches (within 0.1 eV) the ionization potential (IP), or the energy difference between the vacuum level and the highest occupied molecular orbital (HOMO), of the matrix (or host) materials, resulting in energetically favorable electron transfer from the HOMO of the matrix molecule to the $F_4$-TCNQ LUMO. See, W. Gao and A. Kahn, Org. Electron. 3, 53 (2002), which is incorporated by reference in its entirety. Similarly, a strong organic donor whose IP matches the EA of the host may lead to n-doping. However, the EA for electron transporting materials used in OLEDs is typically 3–4 eV. See, I. G. Hill, D. Milliron, J. Schwartz, and A. Kahn, Appl. Surf. Sci. 166, 354 (2000), which is incorporated by reference in its entirety. Organic donors with such a low IP may be chemically unstable in air. Alternatively, alkali metals such as Li and Cs have been used for n-doping of electron transporting layers in OLEDs. J. Huang, M. Pfeiffer, A. Werner, J. Blochwitz, K. Leo, and S. Liu, Appl. Phys. Lett. 80, 139 (2002); and J. Kido and T. Matsumoto, Appl. Phys. Lett. 73, 2866 (1998), which are incorporated by reference in their entireties. Although conductivities up to $10^{-4}$ S/cm can be achieved, see, J. Huang, J. Blockwitz-Nimoth, M. Pfeiffer, and K. Leo, J. Appl. Phys. 93, 838 (2003), which is incorporated by reference in its entirety, this method has drawbacks in that the high doping ratios (~1:1 molar ratio) significantly alter the matrix properties, and metal ion diffusion causes problems in device stability. Recently, A. G. Werner, F. Li, K. Harada, M. Pfeiffer, T. Fritz, and K. Leo, Appl. Phys. Lett. 82, 4495 (2003), which is incorporated by reference in its entirety, reported a new approach for n-doping by using an organic salt, pyronin B (PyB) chloride, as a precursor and creating the stable donor cation in situ. This may circumvent the chemical stability issue of strong organic donors, although it still requires the HOMO of the donor cation (which is half-filled) to be above the LUMO of the host. Additionally, this n-type conductivity may vanish when the samples are exposed to air, id., therefore the stability of such a doped layer in an OLED is unclear. There is a need for further understanding of the fundamental doping mechanisms and to improvements in the conductivity and stability of the doped layers, especially for n-doping, which is fulfilled in part by the present disclosure.

Many different types of devices may be fabricated in accordance with embodiments of the invention. Examples include organic light emitting devices (OLEDs), organic transistors, organic photodetectors, and organic photovoltaic cells. Combinations of these devices may also be advantageuosly fabricated in accordance with embodiments of the invention, such as an array of OLEDs that is controlled by n-type transistors, p-type transistors, or both, where the transistors and/or the OLEDs are fabricated using layers that include two organic materials, where the LUMO of one material is close to the HOMO of the other material.

FIG. 1 shows an organic light emitting device (OLED) 100 that may be fabricated in accordance with embodiments of the invention. OLED 100 is fabricated over a substrate 110, and may include an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 may be a compound cathode having a first conductive layer 162 and a second conductive layer 164. Device 100 may be fabricated by depositing the layers described, in order. The Figures are not necessarily drawn to scale.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material or combination of materials capable of transporting holes. In an embodiment of the invention, hole transport layer comprises a first organic material acts a dopant in hole transport layer 125, doped into a second organic material that acts as a host in hole transport layer 125, where the first organic material has an electron affinity that is close to the ionization potential of the second organic material, as described in greater detail below.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 145 may include a material or combination of materials capable of transporting electrons. In an embodiment of the invention, electron transport layer comprises a first organic material acts a host in electron transport layer 145, doped with a second organic material that acts as a dopant in electron transport layer 145, where the first organic material has an electron affinity that is close to the ionization potential of the second prganic material, as described in greater detail below. The first and second organic materials of hole transport layer 125 and electron transport layer 145 may be the same materials, but present in different concentrations in each layer, such that the first organic material is a host in electron transport layer 145, and a dopant in hole transport layer 125, whereas the second organic material is a dopant in electron transport layer 145, and a host in hole transport layer 125.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. In a preferred embodiment, this charge carrying component is the first organic material described above with reference to the electron transport layer 145. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Published Patent Application No. 2003-0230980 A1 to Forrest et al., which are incorporated by reference in their entireties.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. Patent Published Application No. US 2004-0174116 A1 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. Patent Published Application No. US 2004-0174116 A1 to Lu et al., which is incorporated by reference in its entirety.

Figure 2:
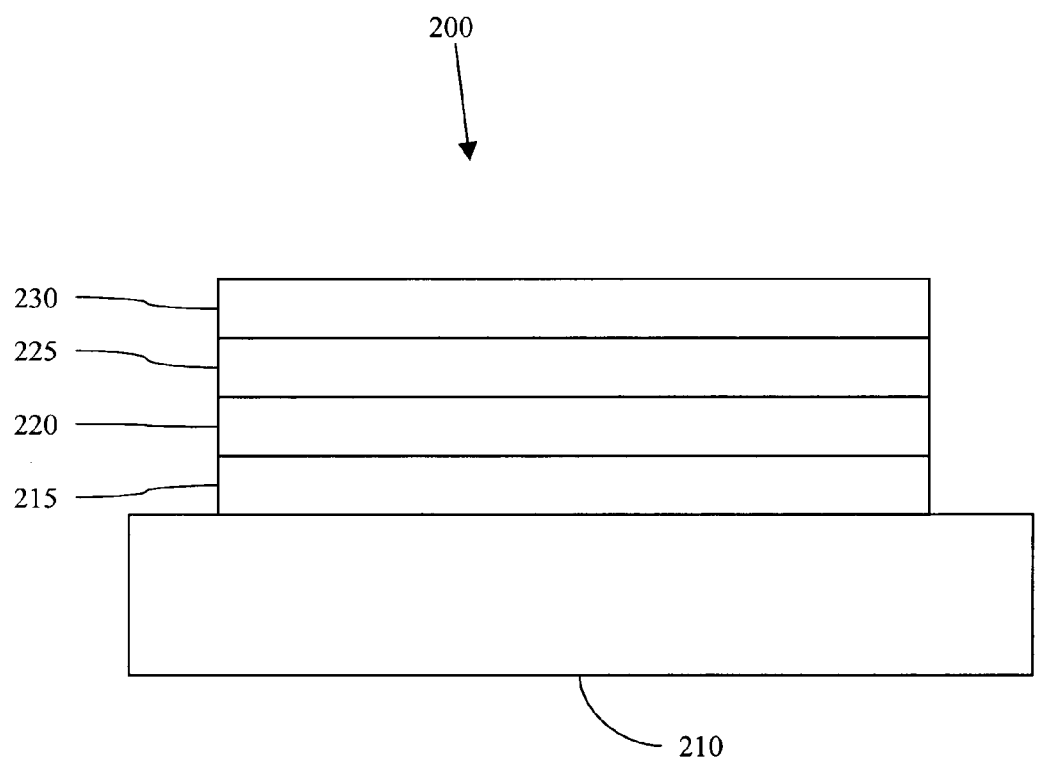
FIG. 2 shows an inverted organic light emitting device that does not have a separate electron transport layer shows.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

Figure 3:
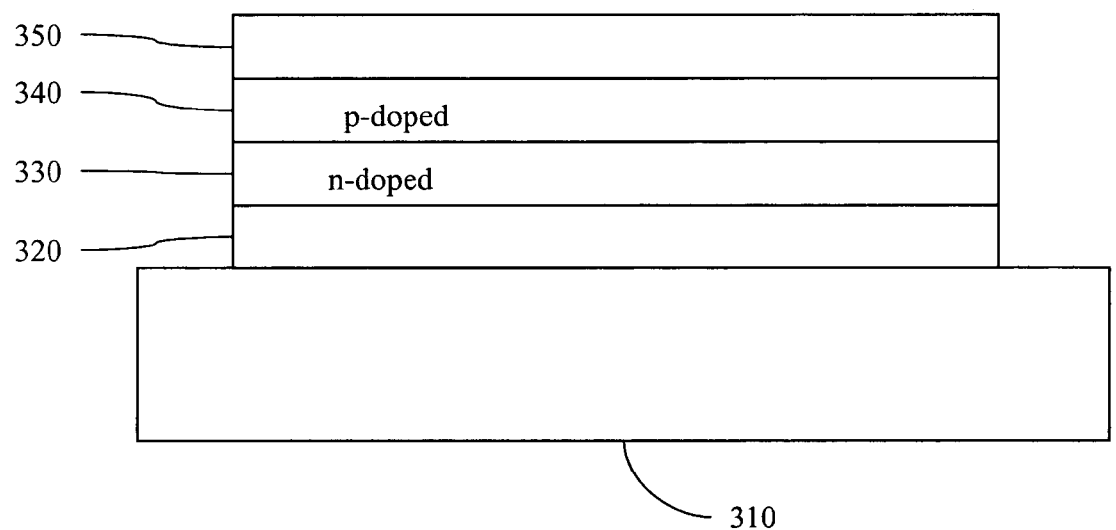
FIG. 3 shows an embodiment of the invention in which a pair of organic materials, such that the electron affinity of a first organic material is close to the ionization potential of the a second organic material, are used to fabricate a p-doped layer and an n-doped layer in the same device.

FIG. 3 shows an embodiment of the invention in which a pair of organic materials, such that the electron affinity of a first organic material is close to the ionization potential of the a second organic material, are used to fabricate a p-doped layer and an n-doped layer in the same device. The first and second layer may be separate from each other, for example as illustrated in FIG. 1 where the n-doped layer is electron transport layer 145, and the p-doped layer is hole transport layer 125. Although FIG. 1 illustrates an OLED, other devices may also have an ETL and HTL that are not in physical contact with each other in accordance with embodiments of the invention. The first and second layer may be in direct physical contact with each other to form a heterojunction, for example as illustrated in FIG. 3. FIG. 3 shows a device having an n-p heterojunction, where n-doped layer 330 and p-doped layer 340 are in direct contact with each other. The device of FIG. 3 also includes a cathode 320 and an anode 350, and the device is fabricated over a substrate 310.

Figure 4:
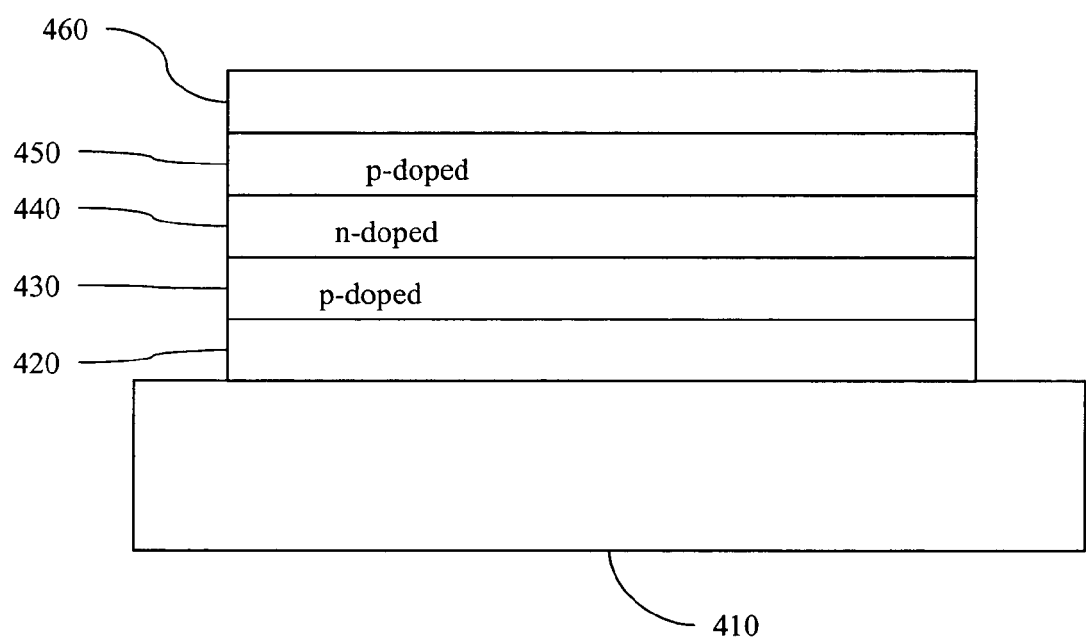
FIG. 4 shows a device having a p-n-p heterojunction.

More than one p-doped or n-doped layer may be present in a device, for example as illustrated in FIG. 4. FIG. 4 shows a device having a p-n-p heterojunction, where p-doped layers 430 and 450 are both in direct contact with n-doped layer 440. The device of FIG. 4 also includes a first electrode 420 and a second electrode 460. The device is fabricated over a substrate 410. It is understood that devices having other heterojunctions, including an n-p-n heterojunction, may also be fabricated in accordance with embodiments of the invention.

Diodes and transistors are examples of devices that may be included in embodiments of the invention having p-doped and n-doped layers that both include the same two organic materials, such that the electron affinity of a first organic material is close to the ionization potential of the a second organic material, and where the layers are in direct contact with each other.

Figure 5:
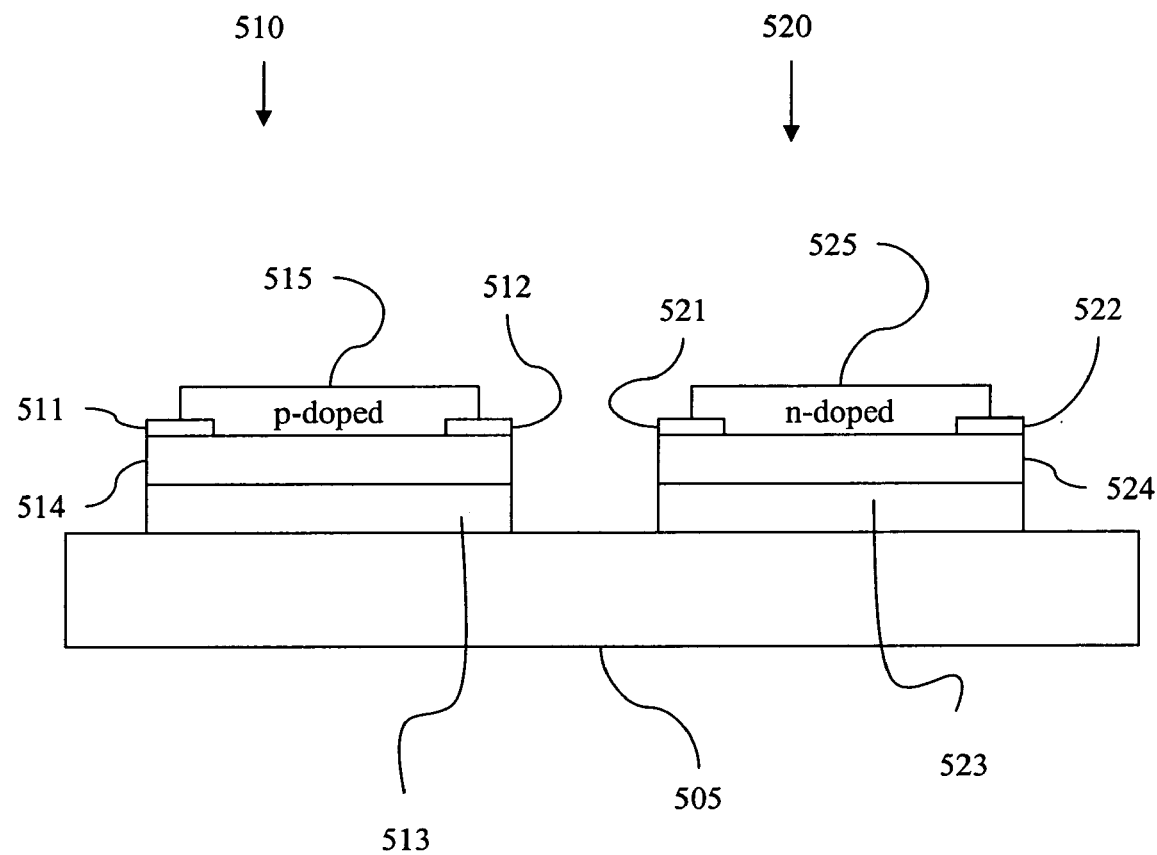
FIG. 5 shows both p-type and n-type organic thin-film transistors (OTFTs) on the same substrate.

In an embodiment of the invention, p-doped and n-doped layers that both include the same two organic materials, such that the electron affinity of a first organic material is close to the ionization potential of the a second organic material, may be parts of separate devices fabricated on the same substrate. Such an embodiment may be useful, for example, for fabricating both p-type and n-type organic thin-film transistors (OTFTs) on the same substrate. FIG. 5 shows an example of such an embodiment. p-type TFT 510 includes a source 511, a drain 512, a gate 513, an insulator 514, and a channel 515. Channel 515 is an organic p-doped layer, with a host having an electron affinity near the ionization potential of the dopant. n-type TFT 520 includes a source 521, a drain 522, a gate 523, an insulator 524, and a channel 525. Channel 525 is an organic n-doped layer, having the same two organic materials as channel 515, but where the host has an ionization potential near the electron affinity of the dopant, i.e., the host of layer 515 is the dopant of layer 525, and the dopant of layer 515 is the host of layer 525. TFTs 510 and 520 are fabricated over a substrate 505.

The embodiment of FIG. 5 may be particularly useful for several reasons. One reason is that, when using certain substrates, it is easier to fabricate certain types of transistors using the substrate material. For example, it is easier to fabricate n-type TFTs in silicon than p-type TFTs. The embodiment of FIG. 5 allows both n-type and p-type transistors to be readily fabricated, irrespective of the electrical properties of the substrate, which provides additional design freedom.

The simple layered structures illustrated in FIGS. 1–5 are provided by way of non-limiting example, and it is understood that embodiments of the invention may be used in connection with a wide variety of other structures. The specific materials and structures described are exemplary in nature, and other materials and structures may be used. Functional OLEDs and other devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1–5. Although specific examples of placement of an n-doped and/or p-doped layer are illustrated, it is understood that other configurations are within the scope of embodiments of the invention.

Structures and materials not specifically described may also be used, such as OLEDs and other devices comprised of polymeric materials (PLEDs) such as disclosed in U.S. Pat. No. 5,247,190, Friend et al., which is incorporated by reference in its entirety. By way of further example, OLEDs and other devices having a single organic layer may be used. Devices may be stacked, for example as described in U.S. Pat. No. 5,707,745 to Forrest et al, which is incorporated by reference in its entirety. Device structures may deviate from the simple layered structure illustrated in FIGS. 1–5. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20–25 degrees C.).

Figure 6:
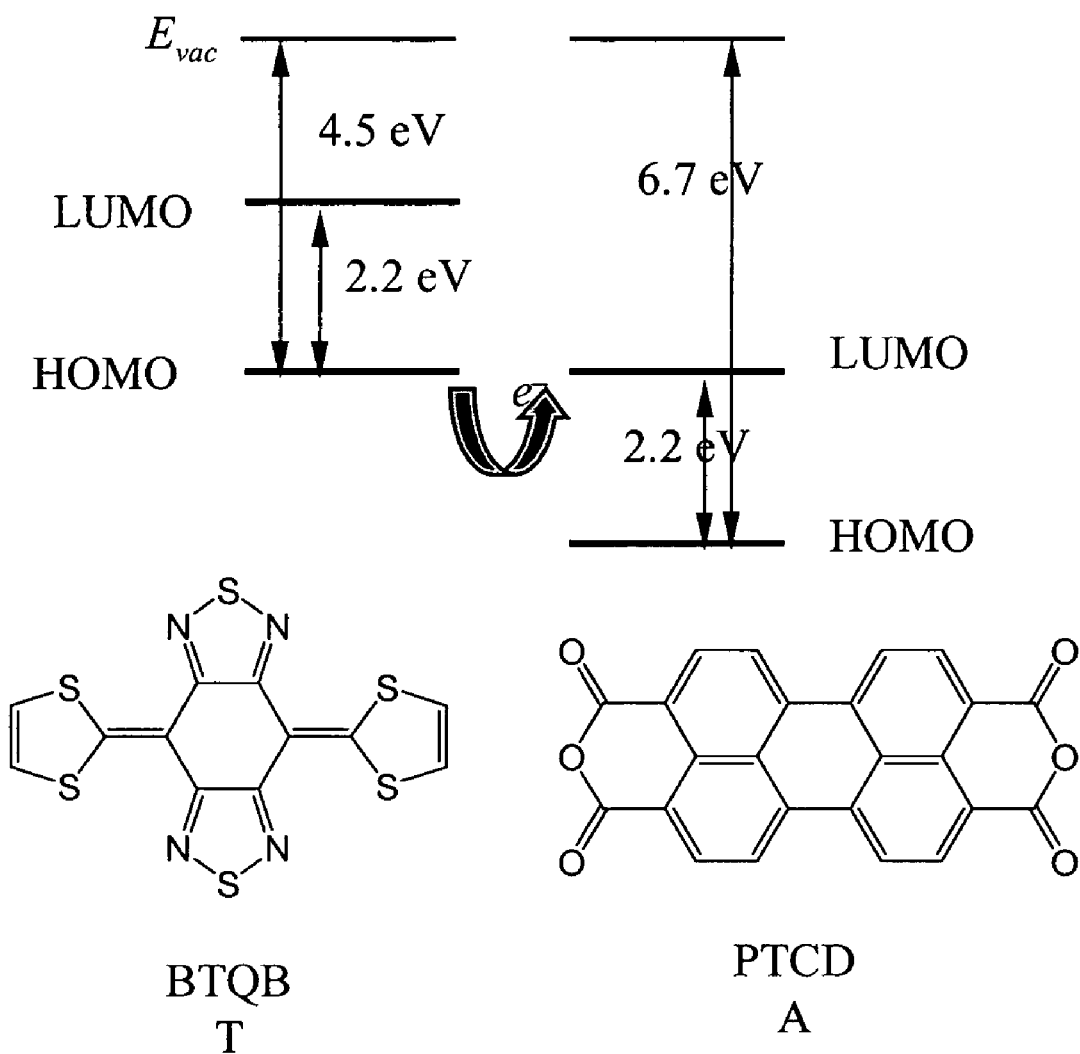
FIG. 6 shows molecular structures and energy level diagrams of BTQBT and PTCDA.

FIG. 6 shows molecular structures and energy level diagrams of BTQBT and PTCDA. These materials provide an example of two organic materials, where the ionization potential of one material is close to the electron affinty of the other material. $E_{vac}$ stands for the vacuum level. 3,4,9,10-perylenetetracarboxylic dianhydride (PTCDA) and bis(1,2,5-thiadiazolo)-p-quinobis(1,3-dithiole) (BTQBT) are planar stacking molecules from which bipolar doping can be achieved. Both materials have strong π-electron interactions along the stacking direction. Additionally, BTQBT also has strong in-plane interactions between neighboring molecules via S . . . S contacts. The ionization potentials of BTQBT and PTCDA are reported in the literature to be 4.6 eV and 6.7 eV, respectively. As the optical gaps of both materials are reported in the literature to be 2.2 eV, this suggests the PTCDA LUMO is nearly at the same energy level as the BTQBT HOMO, as shown in FIG. 6, leading to electron transfer from a BTQBT molecule to a nearby PTCDA molecule. In addition, the two materials have similar molecular sizes and crystal structures, which may assist in leading to bipolar doping where BTQBT molecules act as donors in a PTCDA matrix, and conversely, PTCDA molecules act as acceptors in a BTQBT matrix.

In general terms, the term "host" means the molecule in a layer that is most prevalent, and generally is present in a concentration of greater than 50% molar. The term "dopant" refers to molecules other than the host in a particular layer, present in a concentration less than 50% molar. As a practical matter in the context of the p-type and n-type doping discussed herein, it is expected that any particular dopant will be present in a concentration preferably less than about 20% molar, more preferably less than 10% molar, and most preferably about 1–5% molar, although concentrations outside of these ranges may be favorable in certain embodiments. Dopant concentrations that are too high may lead to undesirable interactions between dopant molecules, and/or lead to a host concentration that is too low to achieve desired results. Dopant concentrations that are too low may not result in the dopant having its desired effect.

In an embodiment of the invention, a first layer that includes the first organic material as host and the second organic material as dopant may act as an electron transport layer, with a higher conductivity than a neat layer of the first organic material due to the higher electron concentration provided by the dopant. A second layer that includes the second organic material as host and the first organic material as dopant may act as a hole transport layer, with a higher conductivity than a neat layer of the second organic material due to the higher hole concentration provided by the dopant.

Because conductivity is dependent upon both carrier concentration and carrier mobility, the first organic material preferably has a high electron mobility, and the second organic material preferably has a high hole mobility. Many amorphous organic materials have carrier mobilities of about $10^{-6}$ to $10^{-5}$ cm$^2$/V-sec. A mobility of at least about $10^{-5}$ cm$^2$/V-sec may be considered "high" in this context, although the mobility is preferably at least about $10^{-3}$ cm$^2$/V-sec, and more preferably at least about 0.01 cm$^2$/V-sec. But, embodiments of the invention may be used to improve the conductivity of a layer regardless of carrier mobility.

Many embodiments of the invention have advantages in addition to providing n-doped and/or p-doped organic layers having a high conductivity. For example, using the same two materials to form both p-type and n-type layers simplifies device fabrication, because only two material sources are needed, which can be an important factor in reducing the amount of capital equipment needed. Conventional devices may need at least four material sources to fabricate both p-doped and n-doped layers, with a separate host material and dopant material for each layer.

In addition, the use of organic dopants may have additional favorable properties. Some inorganic dopants, such as Li, can diffuse rapidly through many organic layers. As a result, such dopants may diffuse into layers or parts of layers where they are not intended. For example, Li may diffuse into the emissive layer of an OLED, and cause undesirable quenching. While there may be ways of mitgating such diffusion, for example the use of a buffer layer between the Li doped part of a device and other parts of the device, there may be other undesirable factors associated with such mitigation, such as the need for an additional layer with its attendent fabrication burden and the possibility of an addition to operating voltage. It is expected that organic dopants will have a much reduced ability to diffuse in this way, such that cross-contamination of layers is reduced.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

CBP: 4,4'-N,N-dicarbazole-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
$Ir(Ppy)_3$: tris(2-phenylpyridine)-iridium
$Ir(ppz)_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N-N'-di(1-naphthyl)-benzidine
TPD: N,N'-diphenyl-N-N'-di(3-toly)-benzidine
BAlq: aluminum(III)bis(2-methyl-8-quinolinato)4-phenylphenolate
mCP: 1,3-N,N-dicarbazole-benzene
DCM: 4-(dicyanoethylene)-6-(4-(dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)
PTCDA: 3,4,9,10-perylenetetracarboxylic dianhydride
BTQBT: bis(1,2,5-thiadiazolo)-p-quinobis(1,3-dithiole)
F16-CuPc: copper hexadecafluorophtalocyanine Experimental:

Specific representative embodiments of the invention will now be described, including how such embodiments may be made. It is understood that the specific methods, materials, conditions, process parameters, apparatus and the like do not necessarily limit the scope of the invention.

Ultraviolet photoemission spectroscopy (UPS) was used to study the electronic structures of heterojunctions between PTCDA and BTQBT. UPS simulates the doped systems while yielding strong photoemission signals from both molecules simultaneously. Conductivities of doped films were measured in a lateral contact geometry at both room and low temperatures, while the polarity of conduction was examined by measuring the output characteristics of OTFTs with a doped or undoped organic film as the active layer. Scanning electron microscopy (SEM) and x-ray diffraction (XRD) measurements were carried out to study the morphology and crystal structure of mixed films. Fourier-transform infrared (FT-IR) spectroscopy was used to study the degree of charge transfer between PTCDA and BTQBT.

Organic thin films were grown by the ultrahigh vacuum (UHV) process of organic molecular beam deposition (OMBD) method in a chamber with a base pressure of $1 \times 10^{-10}$ Torr. Further details may be found in S. R. Forrest, Chem. Rev. 97, 1793 (1997), which is incorporated by reference in its entirety. The PTCDA and BTQBT source materials in the Knudsen cells were purified by gradient sublimation for three cycles before being loaded into the UHV chamber. Each Knudsen cell had an individual shutter in front to switch the respective molecular beam flux between "on" and "off", thereby allowing for the deposition of either material, or the co-deposition of both materials to achieve doping. The deposition rate of each material was controlled by adjusting the temperature of the corresponding Knudsen cell, and was monitored by a quartz crystal placed close to the substrate holder. The deposition rate of the host material was maintained at approximately 1 Å/s, while that of the dopant material was varied from 0.01 to 0.1 Å/s. Unless otherwise indicated, the substrate was at room temperature during deposition of the organic films.

UPS measurements were carried out in a custom-designed UHV chamber (base pressure $1 \times 10^{-10}$ Torr) interconnected with the OMBD growth chamber. Further details may be found in J. Xue and S. R. Forrest, J. Appl. Phys., 95, 1869 (2004). Organic films were grown by OMBD on highly doped n-Si (100) substrates coated with 400-Å-thick in-situ deposited Ag layers. HeI emission (hv=21.22 eV) from a VG UPS/2 lamp obtained from Thermo VG Scientific, West Sussex, East Grinstead RH19 1UB, U.K., was used as the photon source, and the UPS spectra were recorded with a multichannel hemispherical VG CLAM4 electron energy analyzer (also from Thermo VG Scientific), with a pass energy of 2.5 eV. The sample was biased at −3 V with respect to the analyzer, to distinguish between the analyzer and sample cutoffs. The overall resolution of the UPS spectra is approximately 0.1 eV.

The conductivities of BTQBT and PTCDA films were measured using a lateral contact geometry. Glass substrates, cleaned in ultrasonic baths of acetone and isopropanol followed by blowing dry in nitrogen, were loaded into the OMBD chamber, where 1000 Å thick undoped or doped organic films were grown. The samples were then transferred to a nitrogen-filled glove box (oxygen concentration <1 ppm) with a minimal exposure (<2 s) to air. Without further exposure to air, the samples were transferred from the glove box to a high vacuum chamber (base pressure=$1 \times 10^{-7}$ Torr), where a 1000-Å-thick Au or Ag layer was deposited through shadow masks, resulting in 10-mm-long metal contacts at 1 mm apart. The in-plane conductivity of the films was obtained by measuring the current-voltage (I-V) characteristics between neighboring contacts in the glove box using an HP 4155B semiconductor parameter analyzer.

OTFTs with PTCDA as the active layer were fabricated using the top-contact geometry, similar to that illustrated in FIG. 5. See also, J. Xue and S. R. Forrest, Appl. Phys. Lett. 79, 3714 (2001). A 500-Å-thick undoped or doped PTCDA film was deposited on a highly doped n-Si coated with 2000 Å thick thermal oxide, followed by the deposition of drain and source Ag contacts through a shadow mask. The channel length and width are 20 μm and 1 mm, respectively.

A scanning electron microscope (Philips XL30) was used to study the surface morphology of organic films grown on Si(100) substrates. X-ray diffraction patterns of organic films were recorded using a Cu $K_\alpha$ line (λ=1.54 Å). FT-IR spectra of pristine and mixed films of BTQBT and PTCDA deposited on KBr substrates were taken using a Nicolet Protégé 460 spectrometer.

Figure 7:
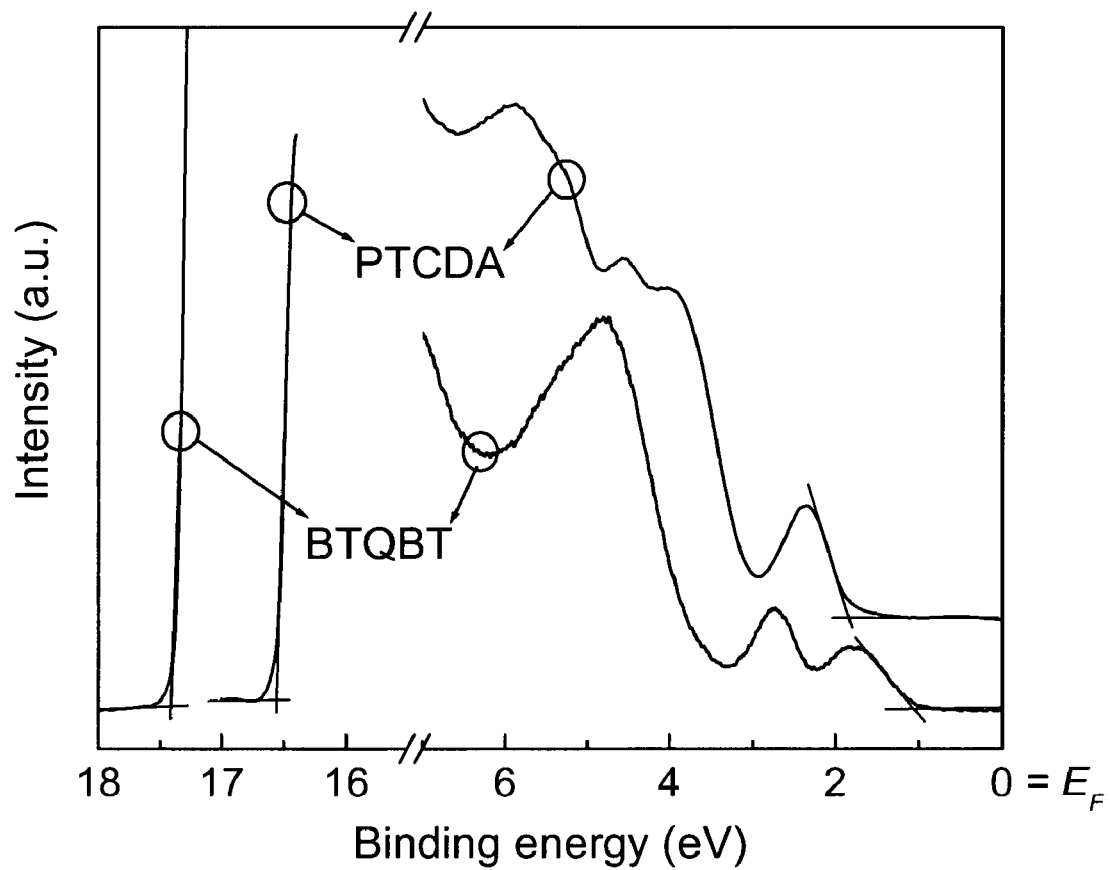
FIG. 7 shows a UPS spectrum of a 200 Å thick pristine BTQBT or PTCDA film grown on a Si(100) substrate coated with a fresh Ag layer

The UPS spectrum of a 200 Å thick pristine BTQBT or PTCDA film grown on a Si(100) substrate coated with a fresh Ag layer is shown in FIG. 7. The thin solid lines illustrate the method used to determine the HOMO position and photoemission onset. The Fermi level $E_F$, obtained from the UPS spectrum of the Ag layer, is used as the reference for the binding energy. The HOMO level position is conventionally taken as the intercept between the tangent of the leading edge of the lowest binding energy feature of the spectrum and the background level. Using the notation $E_L^M$ with L=HOMO or LUMO to represent the HOMO or LUMO energy of molecule M (M=BTQBT or PTCDA), we have $$E_F - E_{HOMO}^{BTQBT} = (1.1 \pm 0.1) \text{ eV, and } E_F - E_{HOMO}^{PTCDA} = (1.9 \pm 0.1) \text{ eV}.$$

The optical gaps of both materials are reported in the literature to be (2.2±0.1) eV. See, I. G. Hill, D. Milliron, J. Schwartz, and A. Kahn, Appl. Surf. Sci. 166, 354 (2000), S. R. Forrest, Chem. Rev. 97, 1793 (1997), J. Xue, J. Qin, P. V. Bedworth, K. Kustedjo, S. R. Marder, and S. R. Forrest, Org. Electron. 2, 143 (2001), which are incorporated by reference in their entireties. This suggests that $E_F$ in the pristine BTQBT film lies right in the middle of the HOMO-LUMO gap, indicating its intrinsic nature. However, in the pristine PTCDA film, $$E_{LUMO}^{PTCDA} - E_F = (0.3 \pm 0.1) \text{ eV},$$

suggesting that the nominally undoped PTCDA film is slightly n-type. This has also been observed in some of the UPS studies referenced in the preceding few sentences, although the origin of impurities contributing to this residual n-type doping is unclear.

Figure 8:
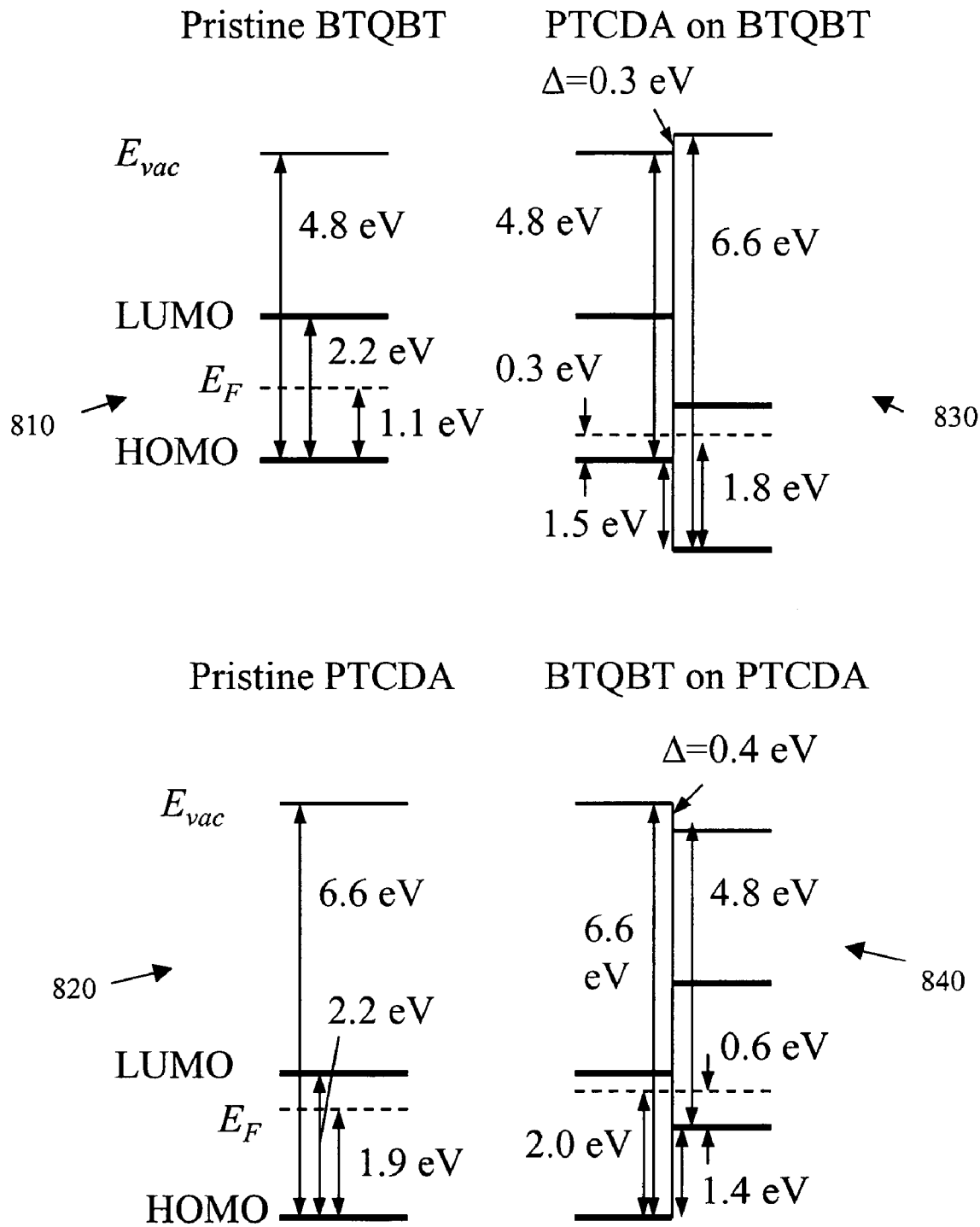
FIG. 8 shows energy level diagrams for BTQBT and PTCDA films.

The low kinetic energy (or high binding energy) cut-offs of the UPS spectra correspond to the onset of photoemission, from which the vacuum level position can be inferred. Thus, by definition, the IP of the pristine BTQBT film is determined to be (4.8±0.1) eV, approximately 0.2 eV larger than previously reported. See, H. Fujimoto, K. Kamiya, S. Tanaka, T. Mori, Y. Yamashita, H. Inokuchi, and K. Seki, Chem. Phys. 165, 135 (1992), which is incorporated by reference in its entirety. The difference may be attributed to the spectral resolution of UPS measurements, and the different substrates and deposition conditions, which may result in different film ordering. The IP of the pristine PTCDA film is measured to be (6.6±0.1) eV in this work, in agreement with previous reports. FIG. 8 summarize the energy level positions in the pristine BTQBT and PTCDA films. Specifically, energy diagram 810 shows an energy diagram for pristine BTQBT, and energy diagram 820 shows an energy diagram for pristine PTCDA.

Photoemission spectroscopy (PES) has been used to study the electronic structures of doped organic systems. See, W. Gao and A. Kahn, Org. Electron. 3, 53 (2002); J. Blochwitz, T. Fritz, M. Pfeiffer, K. Leo, D. M. Alloway, P. A. Lee, and N. R. Armstrong, Org. Electron. 2, 97 (2001); and W. Gao and A. Kahn, J. Appl. Phys. 94, 359 (2003), which are incorporated by reference in their entireties. Since the photoemission signal from the dopant states is weak for a film with a few percent of the dopant, the dopant/host system was simulated with the interface of an ultrathin film of the dopant material deposited on a pristine film of the host material.

Figure 9:
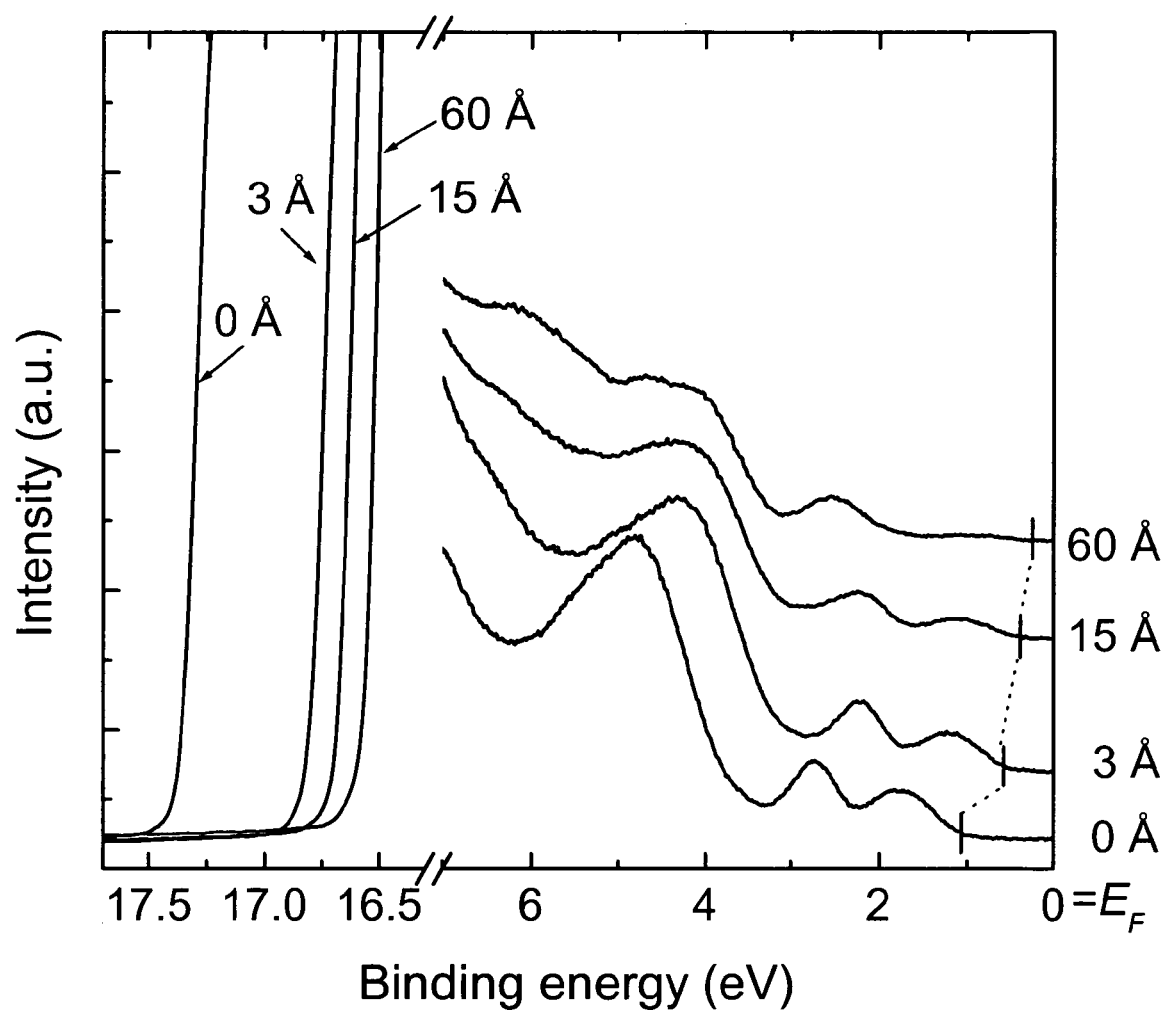
FIG. 9 shows the evolution of the UPS spectrum for a 200 Å thick BTQBT film upon deposition of an ultrathin PTCDA overlayer of varying thickness.

FIG. 9 shows the evolution of the UPS spectrum for a 200 Å thick BTQBT film upon deposition of an ultrathin PTCDA overlayer of varying thickness. With 3 Å thick, or approximately 1 monolayer, of PTCDA deposited onto the BTQBT film, the entire UPS spectrum including the photoemission onset shifts towards lower binding energies by approximately 0.5 eV. This indicates that the Fermi level is 0.5±0.1 eV closer to the BTQBT HOMO. The Fermi level continues to move closer to the BTQBT HOMO as additional PTCDA is deposited. At a cumulative PTCDA thickness of 60 Å, $$E_F - E_{HOMO}^{BTQBT} = (0.3 \pm 0.1) \text{ eV},$$

suggesting that the BTQBT film has changed from intrinsic to p-type.

On the other hand, while the BTQBT features in the UPS spectrum almost diminish at a PTCDA overlayer thickness of 60 Å, the feature centered at a binding energy of about 2.5 eV is due to photoemission from PTCDA, from which we obtain $$E_F - E_{HOMO}^{PTCDA} = (1.8 \pm 0.1) \text{ eV}.$$

This leads to a HOMO level offset between PTCDA and BTQBT of $$E_{HOMO}^{BTQBT} - E_{HOMO}^{PTCDA} = (1.5 \pm 0.1) \text{ eV}.$$

Therefore, as shown in the energy level diagram 830 of FIG. 8, the vacuum level at the organic interface misaligns by (0.3±0.2) eV, indicating dipole formation at the interface.

The UPS spectra of a 200 Å thick PTCDA film with varying coverages of a BTQBT overlayer deposited on top are also measured, with the results summarized in energy level diagram 840 of FIG. 8. Compared with in the pristine film, the Fermi level moves closer to the PTCDA LUMO by ~0.1 eV upon the deposition of a BTQBT overlayer. Here, the HOMO level offset between PTCDA and BTQBT is determined to be (1.4±0.1) eV, slightly less than in the previous case of depositing PTCDA on BTQBT. As shown in energy level diagram 840 of FIG. 8, the misalignment of the vacuum level at this interface indicates the formation of a 0.4 eV dipole.

Figure 10:
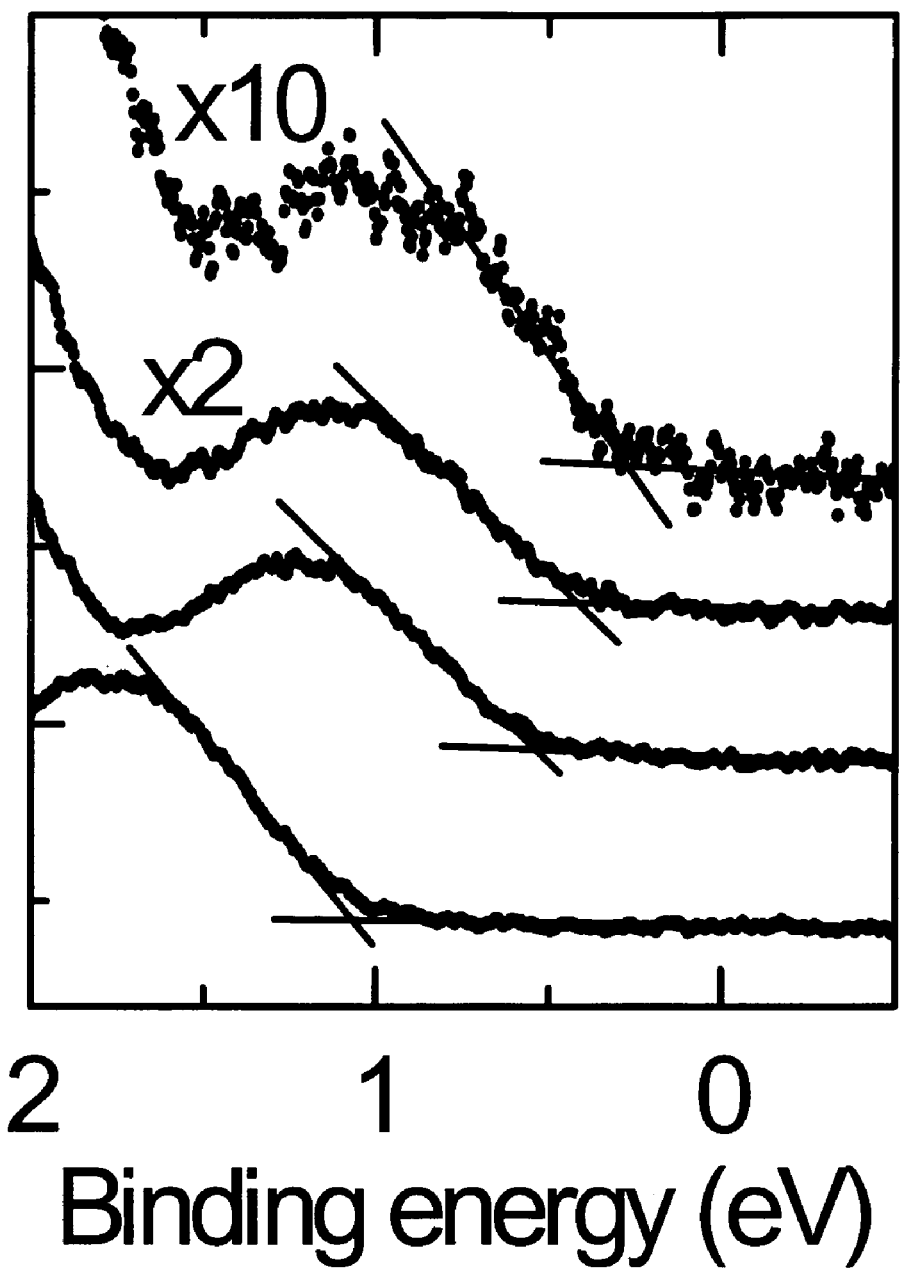
FIG. 10 shows photoemission intensity v. binding energy for the film of FIG. 9.

The short vertical lines marked the position of the BTQBT HOMO, which is determined as shown in FIG. 10, which shows photoemission intensity v. binding energy for the film of FIG. 9.

Figure 11:
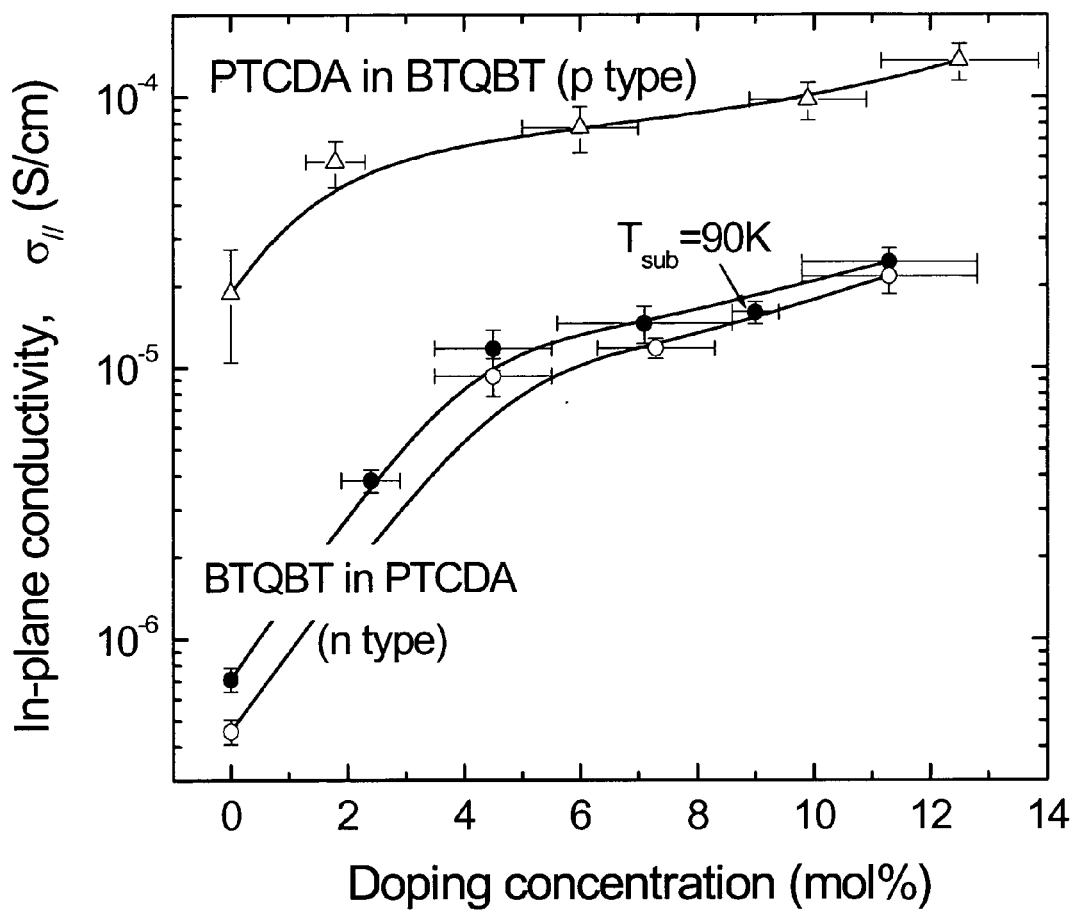
FIG. 11 shows the doping concentration dependence of the in-plane conductivity, $\sigma_{//}$, of the doped PTCDA or BTQBT films, grown by coevaporation of both materials.

FIG. 11 shows the doping concentration dependence of the in-plane conductivity, $\sigma_{//}$, of the doped PTCDA or BTQBT films, grown by coevaporation of both materials. The notation "x % A:B" is used to represent the film of material B doped with x mol % of material A. The in-plane conductivity of PTCDA films increases monotonically with the BTQBT doping concentration. With Ag contacts (filled circles), it increases by >30 fold from $(7.1\pm0.7)\times10^{-7}$ S/cm in the pristine film, to $(2.4\pm0.3)\times10^{-5}$ S/cm in the 11% BTQBT:PTCDA film. Unless otherwise indicated, the substrate was at room temperature during the deposition of the organic films. The conductivity of a 9% BTQBT:PTCDA film grown at a substrate temperature of 90 K is consistent with films grown at room temperature, suggesting that phase segregation during film growth is not significant. The measured conductivity is slightly lower when Au contacts (open circles) were used. This is indicative of the n-type conductivity, as Ag has a lower work function than Au, thus allowing for improved injection of electrons.

Figure 12:
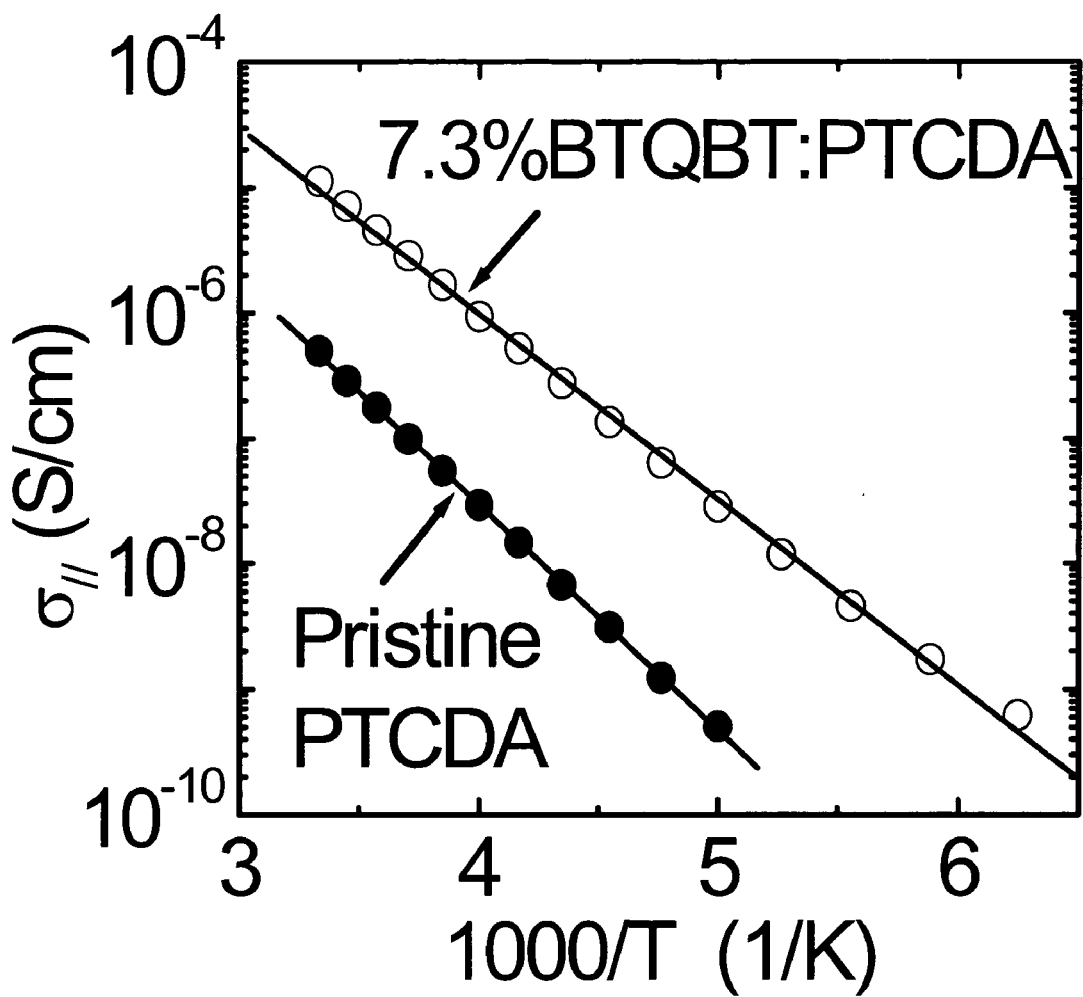
FIG. 12 shows the temperature dependence of $\sigma_{//}$ of a pristine PTCDA and 7.3% BTQBT:PTCDA film.

FIG. 12 shows the temperature dependence of $\sigma_{//}$ of a pristine PTCDA and 7.3% BTQBT:PTCDA film. By fitting $\sigma_{//}(T)$ according to $\sigma_{//}(T)=\sigma_0 \exp(-E_a/kT)$, where $\sigma_0$ is a constant, k is Boltzmann's constant, and T is the temperature, we obtain the thermal activation energy $E_a=(0.36\pm 0.01)$ eV for the pristine PTCDA film, and $E_a=(0.29\pm 0.01)$ eV for 7.3% BTQBT:PTCDA. The filled circles are experimental data, while the lines are linear fits.

The in-plane conductivity of a pristine BTQBT film is $(1.9\pm 0.8)\times 10^{-5}$ S/cm. The UPS measurements show that the pristine BTQBT film is intrinsic. However, due to its relatively small IP (4.8 eV), BTQBT can be oxidized with exposure to air, which could not be totally avoided in our conductivity measurements. In fact, it has been shown that $\sigma_{//}$ of a BTQBT film can be as high as $10^{-3}$ S/cm if the film is exposed to air for an extended period of time. See, J. Xue, J. Qin, P. V. Bedworth, K. Kustedjo, S. R. Marder, and S. R. Forrest, Org. Electron. 2, 143 (2001), which is incorporated by reference in its entirety. The high on-off ratio ($10^8$) of BTQBT-based OTFTs fabricated and characterized in situ, see, M. Takada, H. Graaf, Y. Yamashita, and H. Tada, Jpn. J. Appl. Phys. 41, L4 (2002), which is incorporated by reference in its entirety, also shows the very low intrinsic conductivity of BTQBT, in agreement with UPS measurements.

Upon doping PTCDA into BTQBT, $\sigma_{//}$ also increases monotonically with the doping concnetration. It reaches $(1.4\pm 0.2)\times 10^{-4}$ S/cm at a doping concentration of $(12.5\pm 1.4)$ mol %, or ~10 fold increase compared with the pristine film. We expect the effect of doping on $\sigma_{//}$ of BTQBT films to be more significant if exposure to air can be avoided.

Figure 13:
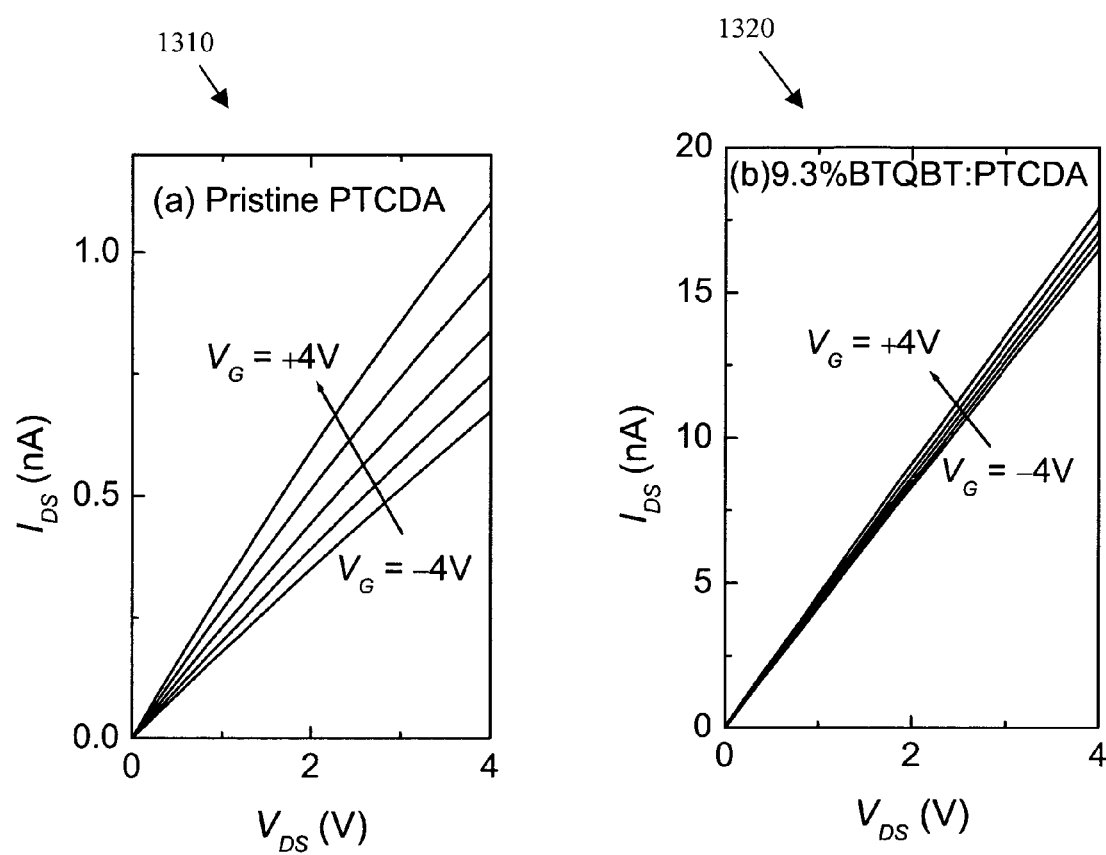
FIG. 13 shows the output characteristics of OTFTs with 500 Å thick PTCDA films as the active layer.

FIG. 13 shows the output characteristics of OTFTs with 500 Å thick PTCDA films as the active layer. Plot 1310 shows output characteristics for an OTFT with a pristine PTCDA film as the active layer, and plot 1320 shows output characteristics for an OTFT with a PTCDA film doped with 9.3 mol % BTQBT. For both transistors, the channel conductivity increases as the gate voltage, $V_G$, becomes more positive, consistent with the n-type conduction in PTCDA films. The source-drain current, $I_{DS}$, of field-effect transistors in the linear regime can be expressed as:

$$I_{DS} = \frac{W}{L}\mu_{FE}C_{ox}(V_G - V_T)V_{DS}, \qquad (1)$$

where W and L are the channel width and length, respectively, $\mu_{FE}$ is the field-effect mobility, $C_{ox}$ is the capacitance of the oxide layer per unit area, $V_T$ is the threshold voltage, and $V_{DS}$ is the source-drain voltage. As W=1 mm, L=20 μm, and $C_{ox}=17.3$ nF/cm², $\mu_{FE}$ is calculated to be $1.6\times 10^{-5}$ cm²/Vs for the pristine PTCDA film and $5.4\times 10^{-5}$ cm²/VS for the 9.3% BTQBT:PTCDA film. The increase in the carrier mobility upon doping, also observed in zinc phthalocyanine (ZnPc) films doped with $F_4$-TCNQ, see M. Pfeiffer, A. Beyer, T. Fritz, and K. Leo, Appl. Phys. Lett. 73, 3202 (1998); and B. Maennig, M. Pfeiffer, A. Nollau, X. Zhou, and K. Leo, Phys. Rev. B 64, 195208 (2001), which are incorporated by reference in their entireties. This increase is characteristic of hopping systems. See, J. Xue and S. R. Forrest, Appl. Phys. Lett. 79, 3714 (2001); and R. Schmechel, J. Appl. Phys. 93, 4653 (2003), which are incorporated by reference in their entireties.

Figure 14:
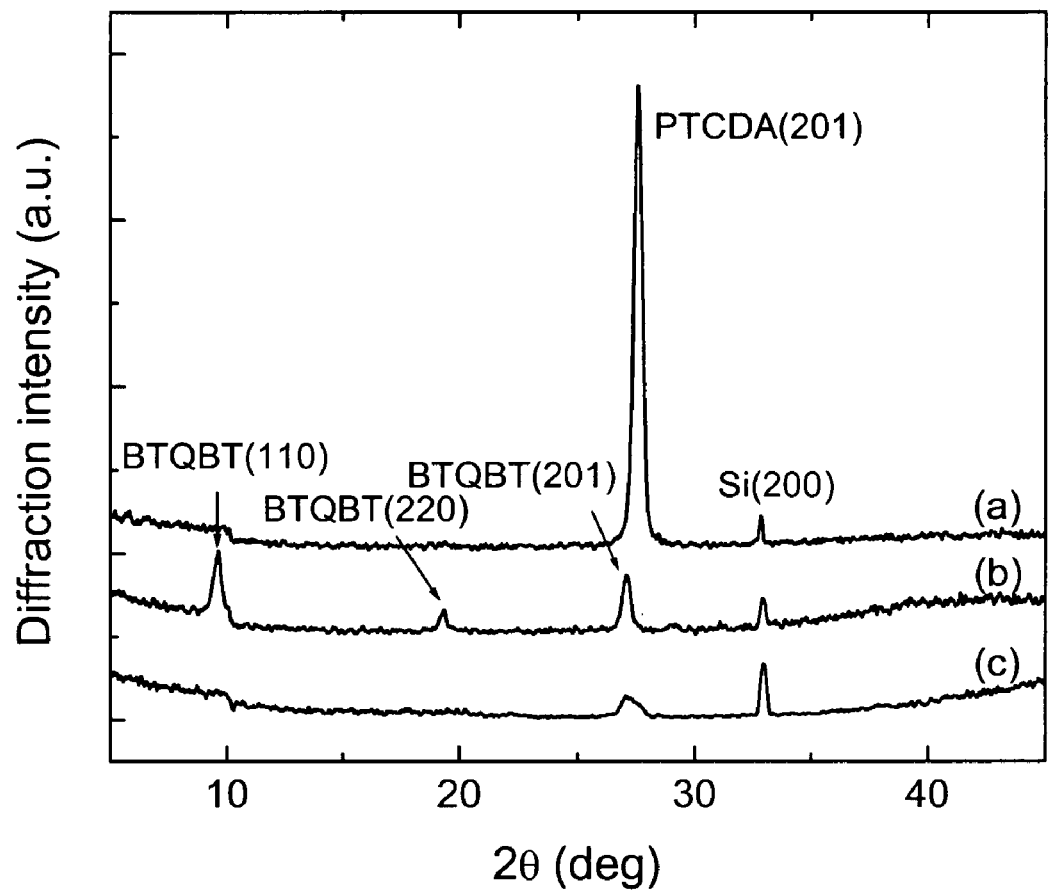
FIG. 14 shows the x-ray diffraction patterns of 500 Å thick organic films on n-Si (100) substrates using Cu $K_\alpha$ line.

FIG. 14 shows the x-ray diffraction patterns of 500 Å thick organic films on n-Si (100) substrates using Cu $K_\alpha$ line. The organic films were (a) pristine PTCDA, (b) pristine BTQBT, and (c) a mixed film of BTQBT and PTCDA with a molar ratio of 1:1. The diffraction from a pristine PTCDA film shows only one prominent (201) peak at $2\theta=27.59°\pm 0.05°$, corresponding to an interplanar stacking distance of $$d_{201}^{PTCDA} = (3.23 \pm 0.01) \text{ Å}.$$

This also indicates that the PTCDA molecules lie flat on the substrate surface, in agreement with previous reports. See, S. R. Forrest, Chem. Rev. 97, 1793 (1997), which is incorporated by reference in its entirety. A similar but less prominent (201) peak at $2\theta=27.10°\pm 0.05°$, corresponding to an interplanar spacing of $$d_{201}^{PTCDA} = (3.29 \pm 0.01) \text{ Å},$$

is observed in the XRD pattern from the pristine BTQBT film. However, the observed BTQBT (110) and (220) diffraction peaks suggest the coexistence of BTQBT crystal domains with different orientations.

Figure 15:
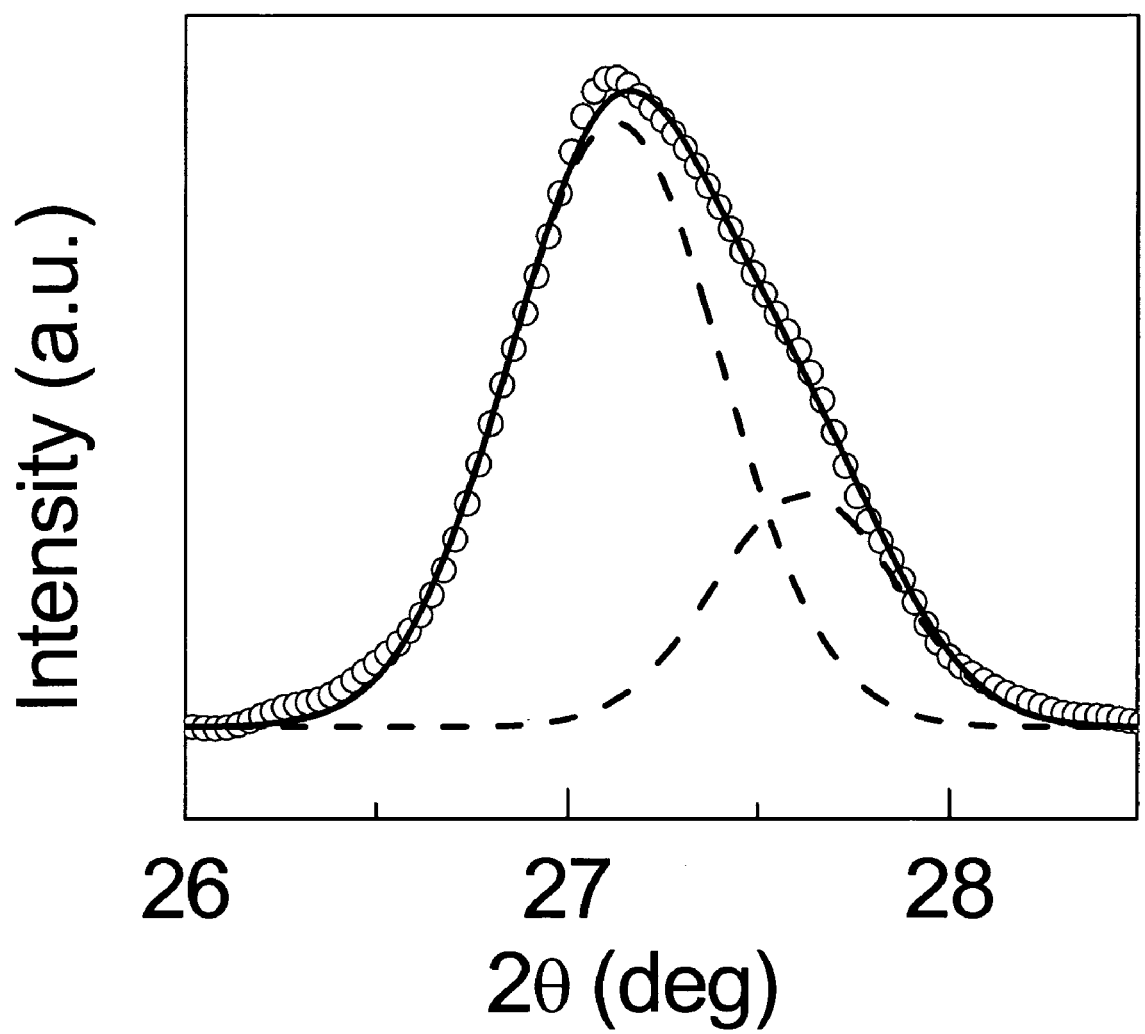
FIG. 15 shows the decomposition of the peak at $2\theta=27.3°$ for the mixed film of FIG. 14.

FIG. 15 shows the decomposition of the peak at $2\theta=27.3°$ for the mixed film of FIG. 14. The open circles are experimental data, dashed lines correspond to the two Gaussian sub-peaks, and the solid line is the sum of the sub-peaks.

For a mixed film with a BTQBT to PTCDA molar ratio of 1:1, the BTQBT (nn0) (n=1,2) peaks disappear, along with a significant decrease in the PTCDA (201) peak intensity. As shown in the inset, the asymmetric peak at about $2\theta=27.3°$ can be decomposed into two Gaussian sub-peaks centering at $2\theta=27.13°\pm 0.03°$ and $27.63°\pm 0.07°$, which correspond to the BTQBT and PTCDA (201) diffraction peaks, respectively. The intensities of these sub-peaks are significantly lower than the corresponding peaks in the pristine films, especially for PTCDA (201), suggesting that only limited extent of phase segregation between BTQBT and PTCDA exists in the mixed film.

Figure 16:
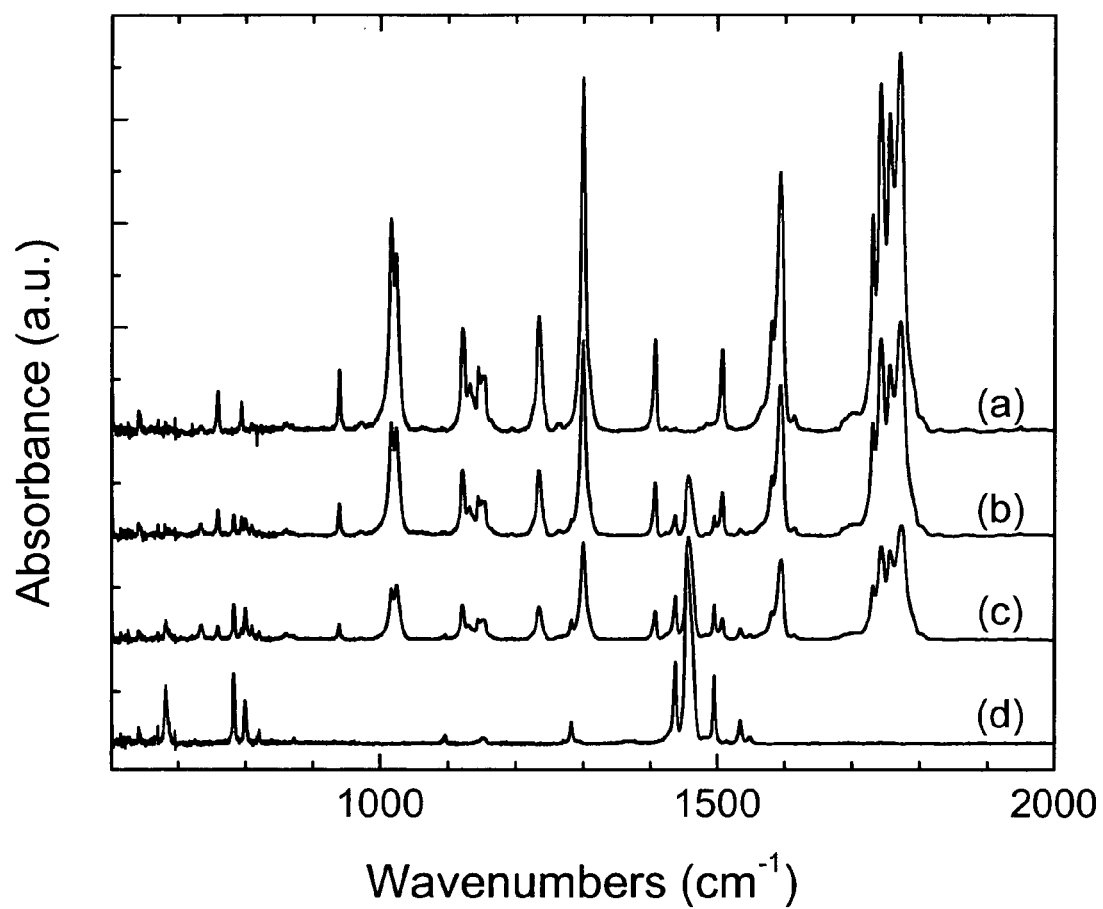
FIG. 16 shows the FT-IR spectra of 500 Å thick organic thin films grown on KBr substrates, with varying concentrations of PTCDA.
Figure 17:
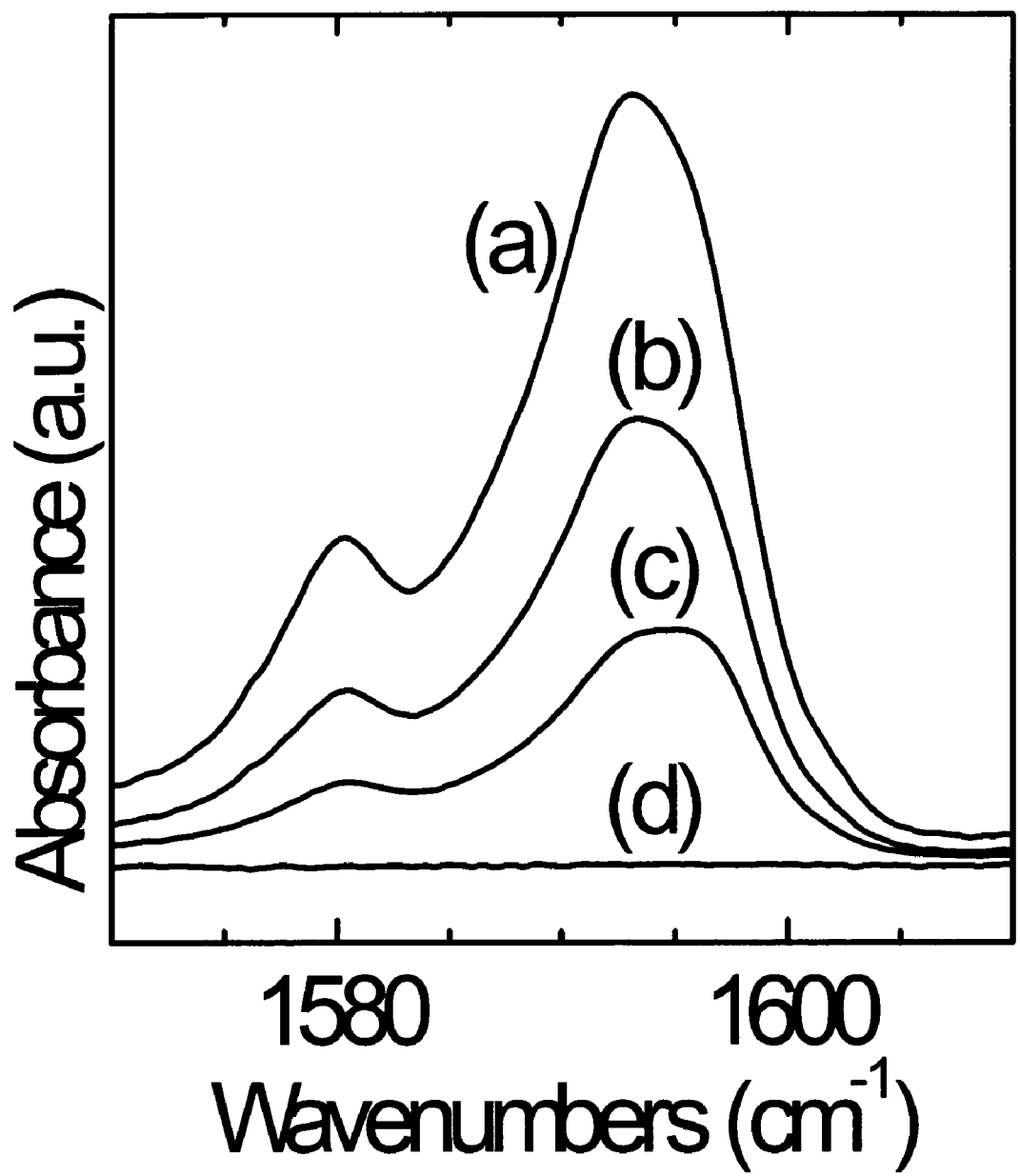
FIG. 17 shows the magnified region of FIG. 16 from 1570 $cm^{-1}$ to 1610 $cm^{-1}$.

FIG. 16 shows the FT-IR spectra of 500 Å thick organic thin films grown on KBr substrates, with varying concentrations of PTCDA mixed with BTQBT. The concentration of PTCDA in these films were (a) 100%, (b) 63%, (c) 30%, and (d) 0%, with the remainder being BTQBT. FIG. 17 shows the magnified region of FIG. 16 from 1570 cm$^{-1}$ to 1610 cm$^{-1}$. The IR spectra of mixed films [spectra (b) and (c)] are basically superpositions of those of the pristine films [spectra (a) and (d)]. No additional noticeable peaks are observed in the spectra of the mixed films. However, the positions of some peaks shift slightly, for example, the PTCDA C=O stretching mode shifts from 1770 cm$^{-1}$ in the pristine PTCDA film to 1773 cm$^{-1}$ in the film with 30% PTCDA. As shown in the inset, the absorption peak at 1593 cm$^{-1}$, corresponding to the C—C stretching mode in PTCDA, undergoes a change in the line shape in the mixed films, with a shoulder observable at 1596 cm$^{-1}$.

UPS measurements reveal that the Fermi level in the BTQBT film moves from the midgap to 0.3 eV above the HOMO level upon deposition of an overlayer of PTCDA on top. This suggests that doping with PTCDA makes the BTQBT film become p-type.

On the other hand, UPS measurements also show that $E_F$ moves towards the PTCDA LUMO by ~0.1 eV when depositing a BTQBT overlayer on a pristine PTCDA film. This, by itself, is not a conclusive evidence of the n-type doping, due to the resolution (0.1 eV) of UPS measurements. However, as demonstrated by OTFT measurements, the majority carriers in both the pristine and doped PTCDA films are electrons. The electron concentration (n) can be estimated using the following equation:

(2)

where e is the electron charge and $\mu_e$ is the in-plane mobility for electrons in the PTCDA film. Note that approximating $\mu_e$ with the field-effect mobility $\mu_{FE}$ may lead to a large error because interface properties between the organic film and the oxide layer may significantly affect $\mu_{FE}$, but not $\mu_e$. Nevertheless, using Eq. (2), we obtain $n=3\times10^{17}$ cm$^{-3}$ in the pristine PTCDA film, and $n=2\times10^{18}$ cm$^{-3}$ in the 9.3% BTQBT:PTCDA film, clearly demonstrating the effect of n-type doping. The increase in the electron concentration also moves $E_F$ closer to the PTCDA LUMO, leading to a reduction of 0.07 eV in the activation energy for $\sigma_{//}$.

Therefore, the bipolar doping effect between PTCDA and BTQBT can be summarized by the following reactions:

(3a)

(3b)

where D=Donor or BTQBT, A=Acceptor or PTCDA, D̃ and Ã are the molecules next to the dopant molecule (A or D), respectively. With D as the matrix and A as the dopant, p-type doping is achieved; whereas with A as the matrix and D as the dopant, n-type doping is achieved.

As shown in Eq. (3), two processes are involved in the entire doping process: electron transfer from D to A to form a charge-transfer (CT) state [$D^{30}$ $A^-$], and the subsequent dissociation of the CT state to transfer the hole/electron to the matrix. The latter process depends on the interaction between matrix molecules as well as the binding energy of the CT state. In planar stacking materials such as PTCDA and BTQBT, the strong π-electron interaction along the stacking direction enables efficient separation of charge carriers created by doping from the ionized dopant molecules. It could pose a problem in an amorphous matrix, however, as the weak interaction among matrix molecules may cause these carriers localize around the ionized dopant.

The overall doping efficiency also depends on the degree of charge transfer, Z. The 0.3–0.4 eV dipole formed at the PTCDA/BTQBT interface, regardless of the deposition sequence, suggests the presence of (partial) charge transfer between these materials. The direction of the dipole is consistent with electron transfer from BTQBT to PTCDA. The Z value has been estimated as the ratio of the shift of the intramolecular vibration frequency in the CT state compared with the neutral molecule, Δν, to that in a fully ionized state, $\Delta\nu_{A^-}$ or $\Delta\nu_{D^+}$. Z=1 is obtained for ZnPc doped with F4-TCNQ.[28] In the current system, Δν=3 cm$^{-1}$ for the C=O and C—C stretching modes of PTCDA. Although no data on $\Delta\nu_{PTCDA^-}$ of the IR-active modes are available, we expect Z<<1 between PTCDA and BTQBT, as $\Delta\nu_{PTCDA^-}$ can be as large as 200 cm$^{-1}$ for some Raman-active modes, see R. Scholz, A. Yu. Kobitski, T. U. Kampen, M. Schreiber, D. R. T. Zahn, G. Jungnickel, M. Elstner, M. Sternberg, and Th. Frauenheim, Phys. Rev. B 61, 13659 (2000), which is incorporated by reference in its entirety, and $\Delta\nu_{F_4-TCNQ^-}$=−34 cm$^{-1}$ for the C≡N stretching mode of F4-TCNQ, see M. Pfeiffer, T. Fritz, J. Blockwitz, A. Nollau, B. Plonnigs, A. Beyer, and K. Leo, Adv. Solid State Phys. 39, 77 (1999), which is incorporated by reference in its entirety. This is actually consistent with the UPS measurements, where IPs of 4.8 eV and 6.6 eV were measured for BTQBT and PTCDA, respectively. Since the BTQBT HOMO level is ~0.4 eV lower in energy than the PTCDA LUMO level (see FIG. 6 with revised IP data), an energy barrier of ~0.4 eV has to be overcome for electrons to transfer from BTQBT to PTCDA. A stronger donor with a smaller IP, or a stronger acceptor with a larger EA, may be used to reduce the charge transfer energy barrier, thereby improving the doping efficiency. Nevertheless, the BTQBT/PTCDA system serves as a prototype organic system for the demonstration of the bipolar doping effect between organic materials.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic device, comprising:
   a first electrode;
   a second electrode;
   a first organic layer disposed between the first electrode and the second electrode, the first organic layer further comprising:
      a first organic material, wherein the first organic layer comprises at least 50% molar of the first organic material;
      a second organic material, wherein the first organic layer comprises less than 50% molar of the second organic material;
   a second organic layer disposed between the first electrode and the second electrode, the second organic layer further comprising:
      the second organic material, wherein the second organic layer comprises at least 50% molar of the second organic material;
      the first organic material, wherein the second organic layer comprises less than 50% molar of the first organic material,
   wherein:
      the first organic layer is an n-type layer, wherein the first organic material is a host and the second organic material is an n-type dopant,
      the second organic layer is a p-type layer, wherein the second organic material is a host and the first organic material is a p-type dopant, and
      the first organic material is PTCDA, and the second organic material is BTQBT.

2. The device of claim 1, wherein the device is an organic light emitting device, and wherein the device further comprises an emissive layer disposed between the n-type layer and the p-type layer.

3. An organic device, comprising:
   a first electrode;
   a second electrode;
   a first organic layer disposed between the first electrode and the second electrode, the first organic layer further comprising:
      a first organic material, wherein the first organic layer comprises at least 50% molar of the first organic material;
      a second organic material, wherein the first organic layer comprises less than 50% molar of the second organic material;

a second organic layer disposed between the first electrode and the second electrode, the second organic layer further comprising:
the second organic material, wherein the second organic layer comprises at least 50% molar of the second organic material;
the first organic material, wherein the second organic layer comprises less than 50% molar of the first organic material,
wherein:
the first organic layer is an n-type layer, wherein the first organic material is a host and the second organic material is an n-type dopant,
the second organic layer is a p-type layer, wherein the second organic material is a host and the first organic material is a p-type dopant, and
the first organic material is F16-CuPc, and the second organic material is BTQBT.

4. An organic device, comprising:
a first electrode;
a second electrode;
a first organic layer disposed between the first electrode and the second electrode, the first organic layer further comprising:
a first organic material, wherein the first organic layer comprises at least 50% molar of the first organic material;
a second organic material, wherein the first organic layer comprises less than 50% molar of the second organic material;
a second organic layer disposed between the first electrode and the second electrode, the second organic layer further comprising:
the second organic material, wherein the second organic layer comprises at least 50% molar of the second organic material;
the first organic material, wherein the second organic layer comprises less than 50% molar of the first organic material,
wherein:
the first organic layer is an n-type layer, wherein the first organic material is a host and the second organic material is an n-type dopant,
the second organic layer is a p-type layer, wherein the second organic material is a host and the first organic material is a p-type dopant, and
the first organic material is F16-CuPc, and the second organic material is CuPc.

5. An organic device, comprising:
a first electrode;
a second electrode;
a first organic layer disposed between the first electrode and the second electrode, the first organic layer further comprising:
a first organic material, wherein the first organic layer comprises at least 50% molar of the first organic material;
a second organic material, wherein the first organic layer comprises less than 50% molar of the second organic material;
a second organic layer disposed between the first electrode and the second electrode, the second organic layer further comprising:
the second organic material, wherein the second organic layer comprises at least 50% molar of the first organic material;
the first organic material, wherein the second organic layer comprises less than 50% molar of the first organic material,
wherein:
the first organic layer is an n-type layer, wherein the first organic material is a host and the second organic material is an n-type dopant,
the second organic layer is a p-type layer, wherein the second organic material is a host and the first organic material is a p-type dopant, and
the electron affinity of the first organic material is within about 0.4 eV of the ionization potential of the second organic material.

6. The device of claim 5, wherein the first organic layer consists essentially of the first and second organic materials, and the second organic layer consists essentially of the first and second organic materials.

7. The device of claim 5, wherein the first organic material is an organic small molecule material, and wherein the second organic material is an organic small molecule material.

8. The device of claim 5, wherein the electron affinity of the first organic material is within about 0.2 eV of the ionization potential of the second organic material.

9. The device of claim 5, wherein the first organic layer and the second organic layer are in direct contact with each other.

10. The device of claim 9, wherein the device is an organic transistor.

11. The device of claim 5, wherein the device is an organic photosensitive device.

12. The device of claim 5, wherein the second organic layer is disposed between the first organic layer and the second electrode.

13. The device of claim 5, wherein the device is an organic light emitting device, and wherein the device further comprises an emissive layer disposed between the n-type layer and the p-type layer.

14. A method of fabricating a device, comprising:
providing a first electrode;
co-depositing a first organic material and a second organic material to form a first organic layer over the first electrode, wherein the first organic material is present in the first organic layer at a concentration at least 50% molar and the second organic material is present in the first organic layer at a concentration of less than 50% molar;
co-depositing the first organic material and the second organic material to form a second organic layer over the first electrode, wherein the second organic material is present in the second organic layer at a concentration at least 50% molar and the first organic material is present in the second organic layer at a concentration of less than 50% molar;
depositing a second electrode over the first and second organic layers,
wherein:
the first organic layer is an n-type layer, wherein the first organic material is a host and the second organic material is an n-type dopant,
the second organic layer is a p-type layer, wherein the second organic material is a host and the first organic material is a p-type dopant, and
the electron affinity of the first organic material is within about 0.4 eV of the ionization potential of the second organic material.

15. The method of claim 14, wherein the electron affinity of the first organic material is within about 0.2 eV of the ionization potential of the second organic material.

16. An apparatus comprising:
a first organic layer comprising:
  a first organic material, wherein the first organic layer comprises at least 50% molar of the first organic material;
  a second organic material;
a second organic layer comprising:
  the second organic material, wherein the second organic layer comprises at least 50% molar of the second organic material;
  the first organic material,
wherein
the second organic material is a donor molecule in the first organic layer,
the first organic material is an acceptor molecule in the second organic layer,
the electron affinity of the first organic material is within about 0.4 eV of the ionization potential of the second organic material, and
the first organic layer and the second organic layer are part of at least one electronic device.

17. The apparatus of claim 16, wherein the electron affinity of the first organic material is within about 0.2 eV of the ionization potential of the second organic material.

* * * * *

UNITED STATES PATENT AND TRADEMARK OFFICE
CERTIFICATE OF CORRECTION

PATENT NO.        : 7,061,011 B2
APPLICATION NO.   : 10/721072
DATED             : June 13, 2006
INVENTOR(S)       : Stephen R. Forrest et al.

It is certified that error appears in the above-identified patent and that said Letters Patent is hereby corrected as shown below:

In Figure 6 please change " $\begin{smallmatrix}BTQB\\T\end{smallmatrix}$ " to -- BTQBT --

In Figure 6 please change " $\begin{smallmatrix}PTCD\\A\end{smallmatrix}$ " to -- PTCDA --

Column 2, line 48, delete "shows".

Column 2, line 52, delete "the".

Column 2, line 62, add a period at the end of sentence.

Column 3, line 25, change "potential of the a" to -- potential of a --

Column 5, line 57, change "advantageuosly" to -- advantageously --

Column 6, line 47, change "material acts a" to -- material that acts as a --

Column 7, line 18, change "material acts a" to -- material that acts as a --

Column 7, line 22, change "prganic" to -- organic --

Column 7, line 42, change "efficiently" to -- efficiency --

Column 9, line 22, delete "the".

Column 9, line 58, change "potential of the a" to -- potential of a --

Column 13, line 12, insert a colon after "MTDATA".

Column 13, line 12, change "methylphenylphenlyamino" to -- methylphenylphenylamino --

Column 13, line 37, change "hexadecafluorophtalocyanine" to -- hexadecafluorophthalocyanine --

Column 17, line 53, change "$cm^2/VS$" to -- $cm^2/V_s$ --

Column 19, line 34, change "$D^{30}$" to -- $D^+$ --

Column 19, line 44, change "carriers localize" to -- carriers to localize --

UNITED STATES PATENT AND TRADEMARK OFFICE
CERTIFICATE OF CORRECTION

PATENT NO.        : 7,061,011 B2
APPLICATION NO.   : 10/721072
DATED             : June 13, 2006
INVENTOR(S)       : Stephen R. Forrest et al.

It is certified that error appears in the above-identified patent and that said Letters Patent is hereby corrected as shown below:

Column 19, line 55, change "$F^4$-TCNQ.$^{28}$" to -- $F^4$-TCNQ. --

Column 19, line 63, change the spacing so that the break is after the equal sign and the line reads $\Delta V_{F_4-TCNQ^-} =$ Signed and Sealed this Seventh Day of August, 2007

JON W. DUDAS
*Director of the United States Patent and Trademark Office*